United States Patent [19]
Matsumoto et al.

[11] Patent Number: 5,196,912
[45] Date of Patent: Mar. 23, 1993

[54] THIN FILM TRANSISTOR HAVING MEMORY FUNCTION AND METHOD FOR USING THIN FILM TRANSISTOR AS MEMORY ELEMENT

[75] Inventors: Hiroshi Matsumoto, Tachikawa; Hiroyasu Yamada, Fussa; Nobuyuki Yamamura, Hanno; Shinichi Shimomaki, Tokyo; Naohiro Konya, Hino; Kyuya Baba, Hachiooji, all of Japan

[73] Assignee: Casio Computer Co., Ltd., Tokyo, Japan

[21] Appl. No.: 668,741

[22] Filed: Mar. 13, 1991

Related U.S. Application Data

[63] Continuation of Ser. No. 427,041, Oct. 25, 1989, abandoned.

[30] Foreign Application Priority Data

| Oct. 28, 1988 | [JP] | Japan | 63-270893 |
| Nov. 10, 1988 | [JP] | Japan | 63-282596 |
| Mar. 31, 1989 | [JP] | Japan | 1-78390 |
| Apr. 7, 1989 | [JP] | Japan | 1-87009 |
| Apr. 14, 1989 | [JP] | Japan | 1-43098[U] |
| Apr. 14, 1989 | [JP] | Japan | 1-43099[U] |
| May 12, 1989 | [JP] | Japan | 1-117580 |

[51] Int. Cl.$^5$ .................. H01L 27/01; H01L 29/68; H01L 29/34
[52] U.S. Cl. ..................... 357/23.7; 357/2; 357/4; 357/54
[58] Field of Search ............ 357/23.7, 4, 23.5, 2, 357/54

[56] References Cited

U.S. PATENT DOCUMENTS

| 3,800,411 | 4/1974 | Abbink et al. | 29/571 |
| 3,859,642 | 1/1975 | Mar | 340/173 |
| 3,878,549 | 4/1975 | Yamazaki et al. | 357/23 |
| 4,053,917 | 10/1977 | Blaha et al. | 357/23 |
| 4,096,509 | 6/1978 | Blaha et al. | 357/23 |
| 4,323,910 | 4/1982 | Sokoloski et al. | 357/23 |
| 4,353,083 | 10/1982 | Trudel et al. | 357/23 |

(List continued on next page.)

FOREIGN PATENT DOCUMENTS

| 0138439 AE | 4/1985 | European Pat. Off. |
| 53-75875 | 7/1978 | Japan | 357/23.7 |
| 55-154767 | 12/1980 | Japan | 357/23.7 |
| 56-29369 | 3/1981 | Japan | 357/23.7 |
| 57-95661 | 6/1982 | Japan | 357/4 |
| 61-51878 | 3/1986 | Japan | 357/23.7 |
| 61-292369 | 12/1986 | Japan | 357/23.7 |
| 63-1072 | 1/1988 | Japan | 357/23.7 |
| 63-129669 | 6/1988 | Japan | 357/23.7 |
| 63-190386 | 8/1988 | Japan | 357/23.7 |
| 63-308384 | 12/1988 | Japan | 357/23.7 |
| WO84/04418 | 11/1984 | PCT Int'l Appl. |

OTHER PUBLICATIONS

Kim et al, "Amorphous silicon thin-film transistors with two-layer gate insulator", Appl. Phys. Letter, vol. 51, No. 21, May 22, 1989.

(List continued on next page.)

Primary Examiner—Andrew J. James
Assistant Examiner—Ngan Van Ngo
Attorney, Agent, or Firm—Frishauf, Holtz, Goodman & Woodward

[57] ABSTRACT

A memory element is formed of a thin film transistor. The thin film transistor has a semiconductor layer, a source electrode electrically connected to the semiconductor layer, a drain electrode electrically connected to the semiconductor layer and formed separately from the source electrode, a gate electrode for controlling formation of a channel of the semiconductor layer, and a gate insulation film for isolating the gate electrode and the semiconductor layer from each other and causing a hysteresis in the relation between the drain current and the gate circuit. The insulation film is a silicon nitride film whose composition ratio of silicon to nitrogen is in a range of approx. 0.85 to 1.1. According to this invention, the relation between the gate voltage and the drain current can be set to have a hysteresis. Therefore, the thin film transistor can be used as a memory element. Further, according to this invention, data can be written, erased and read out by selectively applying an electric field to the gate insulation film. Therefore, the thin film transistor can be used as a memory element.

31 Claims, 17 Drawing Sheets

U.S. PATENT DOCUMENTS

| | | |
|---|---|---|
| 4,481,527 | 11/1984 | Chen et al. .............................. 357/23 |
| 4,533,934 | 8/1985 | Smith ................................. 357/23.7 |
| 4,611,308 | 9/1986 | Lonky ................................... 357/41 |
| 4,667,217 | 5/1987 | Janning .............................. 357/23.7 |
| 4,673,957 | 6/1987 | Ovshinsky et al. ................ 357/23.7 |
| 4,686,558 | 8/1987 | Adam ................................... 357/42 |
| 4,804,637 | 2/1989 | Smayling et al. ..................... 437/52 |
| 4,821,092 | 4/1989 | Noguchi ................................ 357/4 |
| 4,876,582 | 10/1989 | Janning .............................. 357/23.7 |
| 4,885,616 | 12/1989 | Ohta ..................................... 357/2 |
| 4,920,392 | 4/1990 | Nishiura ............................. 357/23.7 |
| 4,951,113 | 8/1990 | Huang et al. ....................... 357/23.7 |
| 5,028,976 | 7/1991 | Ozaki et al. ........................... 357/42 |

OTHER PUBLICATIONS

Interface Modification to Enhance DC and Pulse Response of MNOS Memory Transistors, by McLouishi; Abstract 313, Oct. 22, 1976; pp. 805–807.

PECVD Silicon Nitride: Deposition and Post–Deposition Modification for Application in Memory Devices, Brown, Abstract 274, Oct. 14, 1988, Electrochemical Society Meetings Abstract.

THIN FILM TRANSISTOR HAVING MEMORY FUNCTION AND METHOD FOR USING THIN FILM TRANSISTOR AS MEMORY ELEMENT

This application is a continuation of application Ser. No. 07/427,041, filed Oct. 25, 1989, now abandoned.

BACKGROUND OF THE INVENTION

1. Field of the Invention

This invention relates to a thin film transistor having a memory function and a method for using a thin film transistor as a memory element.

2. Description of the Related Art

As is well known in the art, a thin film transistor includes a gate electrode, a gate insulation film, a semiconductor layer and source and drain electrodes which are formed in a laminated structure. The stagger type, inverted stagger type, coplanar type and inverted coplanar type structures are known as the thin film transistor.

The conventional thin film transistor has no memory function. Further, a method of using the thin film transistor as a memory element is not known in the prior art. However, it is extremely convenient if the thin film transistor has a memory function.

SUMMARY OF THE INVENTION

This invention has been made in view of the above fact, and an object of this invention is to provide a thin film transistor having a memory function and a method for using a thin film transistor as a memory element.

The above object can be attained by a memory element comprising a thin film transistor having a semiconductor layer (4); a source electrode (6) electrically connected to the semiconductor layer; a drain electrode (7) electrically connected to the semiconductor layer and formed separately from the source electrode; a gate electrode (2) for controlling formation of a channel; and insulation film means (3) for isolating the gate electrode (2) from the semiconductor layer (4) and causing a hysteresis in the relation between the drain current and the gate voltage.

The insulation film means includes an SiN film having a composition ratio Si/N of silicon atoms Si to nitrogen atoms N which lies in a range between approx. 0.85 and 1.1.

According to this invention, the gate insulation film means causes a hysteresis in the gate voltage-drain current relation. The thin film transistor may have a memory function due to the hysteresis of the gate voltage-drain current relation and as a result the thin film transistor can be used as a memory element.

Further, the above object can be attained by a method for using a thin film transistor as a memory element comprising the steps of preparing a thin film transistor having a semiconductor layer (4), a source electrode (6), a drain electrode (7), a gate electrode (2) and a gate insulation film; writing first data into the thin film transistor by applying a first voltage to the gate insulation film; writing second data different from the first data by applying a second voltage of a polarity opposite to that of the first voltage to the gate insulation film; and reading data stored in the thin film transistor according to a current which flows in the channel and whose level is changed by a difference in the voltages applied to the gate insulation film.

According to this invention, data can be written into the thin film transistor by applying an adequate voltage to the gate insulation film and then the data can be read out from the thin film transistor. That is, the thin film transistor can be used as a memory element.

DETAILED DESCRIPTION OF THE PREFERRED EMBODIMENTS

There will now be described a first embodiment of this invention with reference to the accompanying drawings.

Figure 1A:
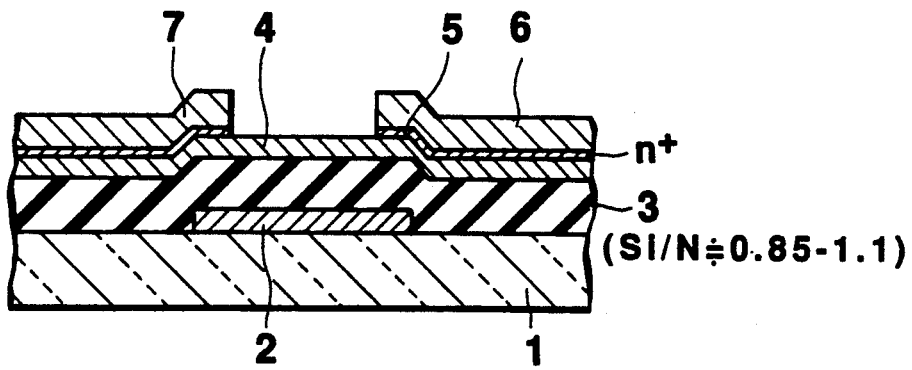
FIG. 1A is a cross sectional view of a thin film transistor having a memory function according to a first embodiment of this invention.
Figure 1B:
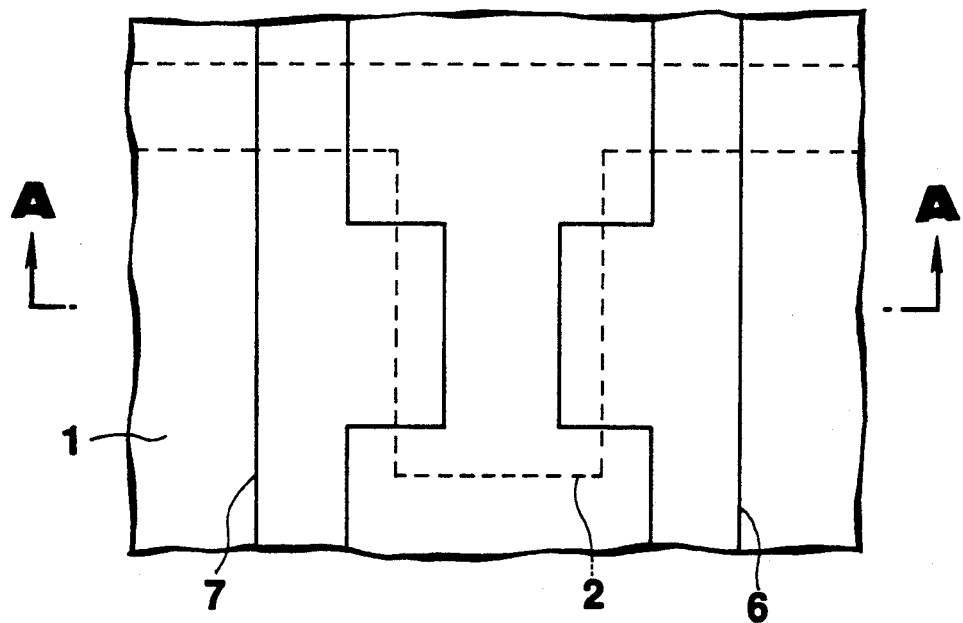
FIG. 1B is a plan view of the thin film transistor according to the first embodiment.

FIG. 1A is a cross sectional view of a thin film transistor having a memory function according to the first embodiment and FIG. 1B is a plan view of the thin film transistor shown in FIG. 1A. FIG. 1A corresponds to a cross sectional view taken along line A—A of FIG. 1B. In FIG. 1B, only main portions are shown for easy understanding the positional relation thereof.

In the first embodiment, the thin film transistor with the memory function has an inverted stagger type structure. The basic structure of the thin film transistor with the memory function is the same as that of the conventional inverted stagger type thin film transistor. However, the film quality (composition) of the gate insulation film of the thin film transistor of this embodiment is different from that of the gate insulation film of the conventional thin film transistor.

The structure of the thin film transistor with the memory function is now explained with reference to FIGS. 1A and 1B. A gate electrode 2 of chromium, Al or the like is formed on an insulation substrate 1 of glass, for example. A gate insulation film 3 is formed on the gate electrode 2. A semiconductor layer 4 of i (intrinsic)-a (amorphous)-Si (silicon) structure with a thickness of approx. 300 to 600 angstrom is formed on the gate insulation film 3. The semiconductor layer may be formed of polycrystalline silicon, monocrystalline silicon or compound semiconductor, for example. Further, $n^+$-a-Si contact layers 5 of N-type high impurity concentration are formed on the semiconductor layer 4 and source electrode 6 and drain electrode 7 are formed on the $n+$-a-Si contact layers 5. The presence of the contact layer 5 permits an ohmic contact to be obtained between the semiconductor layer 4 and the source and drain electrodes 6 and 7.

The gate insulation film 3 is formed of an SiN film having a hysteresis characteristic. More specifically, the gate insulation film 3 is formed of an SiN film with the composition ratio Si/N of silicon atoms Si to nitrogen atoms N which is set larger than the stoichiometric ratio (Si/N=0.75). In this embodiment, the film thickness of the gate insulation film 3 is set at approx. 2000 angstrom and the composition ratio thereof is set at 0.85 to 1.1.

Figure 2A:
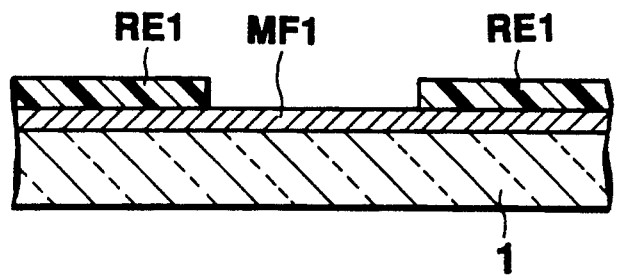
FIGS. 2A and 2B are cross sectional views showing the manufacturing process of the thin film transistor according to the first embodiment.
Figure 2B:
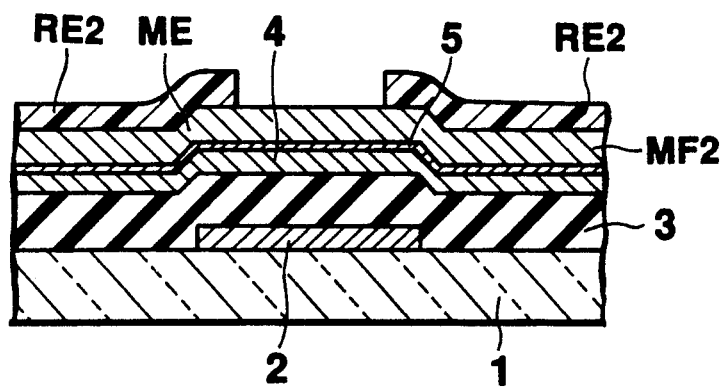

Now, the manufacturing process of the thin film transistor with the memory function is explained with reference to FIGS. 2A and 2B. First, a metal film MF1 is formed to a thickness of approx. 500 angstrom on the insulation substrate 1 by the sputtering or CVD method. After this, a photoresist film is formed on the metal film MF1 which is then etched out as shown in FIG. 2A. The film MF1 is patterned with the remaining photoresist film RE1 used as a mask so as to form a gate electrode. Then, an SiN film constituting the gate insulation film 3, i-a-Si semiconductor layer 4 and $n^+$-a-Si contact layer 5 are sequentially formed on the resultant structure by the plasma CVD method. Further, a metal film or photoresist film MF2 is formed on the resultant structure and a photoresist film is formed on the film MF2. The photoresist film is etched out as shown in FIG. 2B. The film MF2 is patterned with the remaining photoresist film RE2 used as a mask so as to form a source electrode 6 and a drain electrode 7. Further, that portion (channel portion) of the contact layer 5 which lies between the source electrode 6 and the drain electrode 7 is etched out with the photoresist film RE2 used as a mask. As the result of this, the structure shown in FIG. 1A is obtained.

Formation of the SiN film constituting the gate insulation film 3 by us of the plasma CVD method is effected by selectively setting the flow rate ratio of $SiH_4$ to $NH_3$ used as the main component gases in the process such that the composition ratio Si/N of an SiN film to be formed can be set within the range of 0.85 to 1.1. For example, the flow rate ratio of $SiH_4$ to $NH_3$ is set to 42:48. The gate insulation film (SiN film) 3 has a sufficiently large hysteresis characteristic.

FIGS. 3A to 3D show the result of measurement made for the $V_G$-$I_D$ characteristic (the relation between the gate voltage $V_G$ and the drain current $I_D$) of the thin film transistor with the film thickness of the gate insulation film (SiN film) 3 set at 2000 angstrom in a case where the composition ratio of Si/N of the gate insulation film 2 is changed.

Figure 3A:
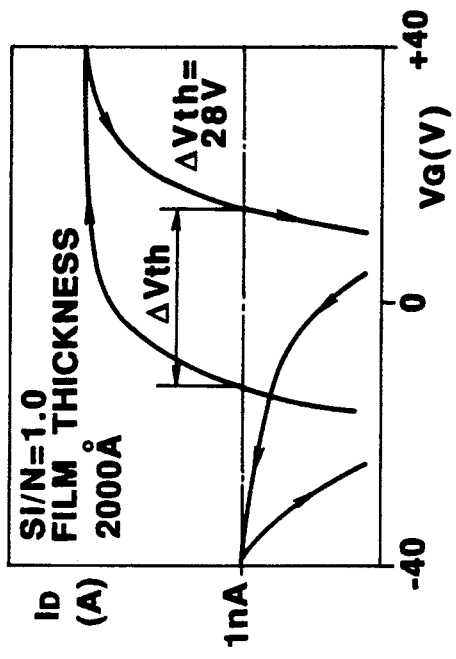
FIGS. 3A to 3D are graphs showing the relation between the $V_G$-$I_D$ characteristic and the composition ratio of Si/N of the gate insulation film of the thin film transistor with the thickness of the gate insulation film set at 2000 angstrom.
Figure 3B:
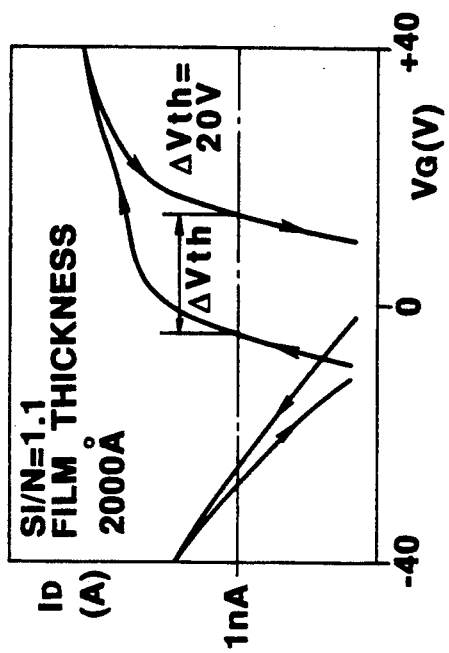
Figure 3C:
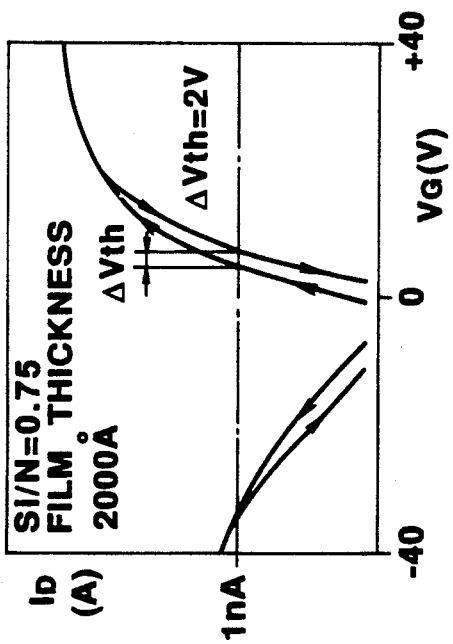
Figure 3D:
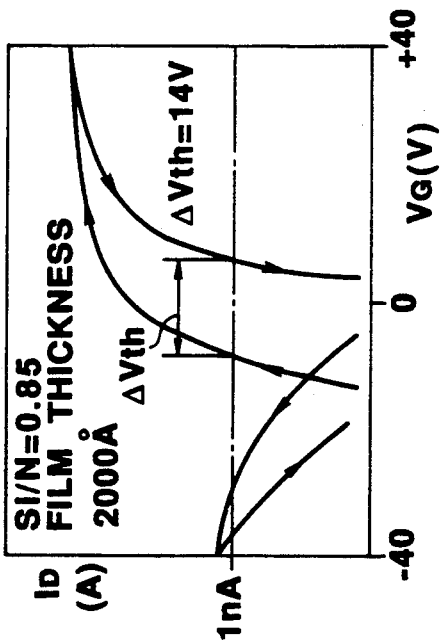

FIG. 3A shows the $V_G$-$I_D$ characteristic in a case where the composition ratio Si/N is set at 0.75 (which is the composition ratio of Si to N when the gate insulation film of the conventional thin film transistor is formed of $Si_3N_4$), FIG. 3B shows the $V_G$-$I_D$ characteristic in the case of Si/N=0.85, FIG. 3C shows the $V_G$-$I_D$ characteristic in the case of Si/N=1.0 and FIG. 3D shows the $V_G$-$I_D$ characteristic in the case of Si/N=1.1.

FIGS. 3A to 3D show the result of measurement of variation in the drain current (current flowing in the channel between the source electrode and the drain electrode) $I_D$ with respect to the gate voltage $V_G$ with the drain voltage $V_D$ set at 10 V.

As is clearly understood from FIGS. 3A to 3D, the $V_G$-$I_D$ characteristic of the thin film transistor in which the gate insulation film is formed of the SiN film having the composition ratio of Si to N of 0.75 displays little hysteresis.

In contrast, each of the characteristics of the thin film transistor in which the gate insulation film is formed of the SiN film having the composition ratio of Si to N of 0.85 to 1.1 displays a relatively large hysteresis as shown in FIGS. 3B to 3D.

In FIGS. 3A to 3D, the degree of delta Vth of the hysteresis is defined as a difference between the gate voltage $V_G$ at which the drain current $I_D$ becomes 1 nA when the gate voltage $V_G$ is gradually changed from a negative value to +40 V and the gate voltage $V_G$ at which the drain current $I_D$ becomes 1 nA when the gate voltage $V_G$ is gradually decreased from +40 V. delta Vth=2 V in FIG. 3A, delta Vth=14 V in FIG. 3B, delta Vth=28 V in FIG. 3C, and delta Vth=20 V in FIG. 3D.

As described above, the $V_G$-$I_D$ characteristic has a relatively large hysteresis characteristic as shown in FIGS. 3B to 3D, and this means that the thin film transistors have the memory function in which charge can be stored in the gate insulation film 3. Therefore, the thin film transistor whose gate insulation film 3 is formed of an SiN film having the composition ratio of Si to N of 0.85 to 1.1 can be used as a memory element in which data can be written or read out by controlling a voltage applied to the gate electrode 2. Further, the thin film transistor with the memory function maintains the influence by a voltage which is finally applied to the gate electrode 2. Therefore, the thin film transistor can be used as a memory element such as an E 2 PROM.

In the above explanation, delta Vth is called "the degree of hysteresis", but delta Vth may be called "the size of hysteresis", "hysteresis width" or "memory width".

Further, in the above explanation, the film thickness of the SiN film used as the gate insulation film 3 is set at 2000 angstrom. However, the film thickness of the SiN film can be selectively set in a range of 500 to 4000 angstrom. It is preferable to set the film thickness in a range of 2000 to 3000 angstrom (which is the thickness of the gate insulation film of the ordinary thin film transistor). In a case where the film thickness of the SiN film is made larger, it becomes necessary to make the range of the Si/N composition ratio narrower than that (Si/N=0.85 to 1.1) set in the case of the film thickness of 2000 angstrom.

Figure 4A:
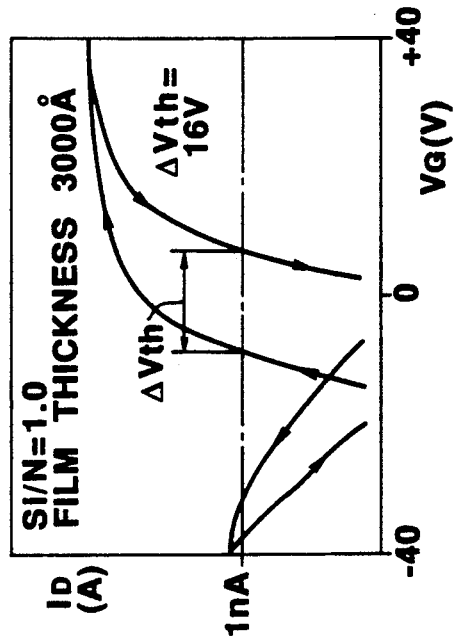
FIGS. 4A to 4D are graphs showing the relation between the $V_G$-$I_D$ characteristic and the composition ratio of Si/N of the gate insulation film of the thin film transistor with the thickness of the gate insulation film set at 3000 angstrom.
Figure 4C:
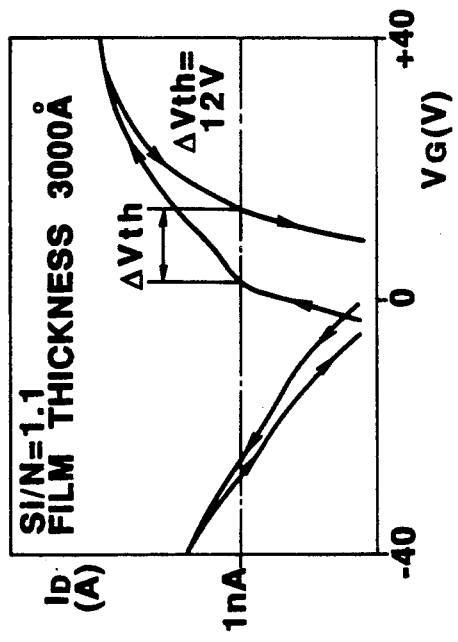
Figure 4B:
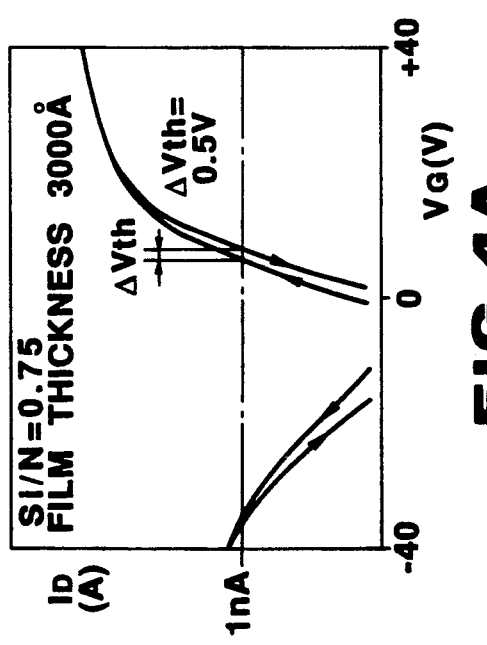
Figure 4D:
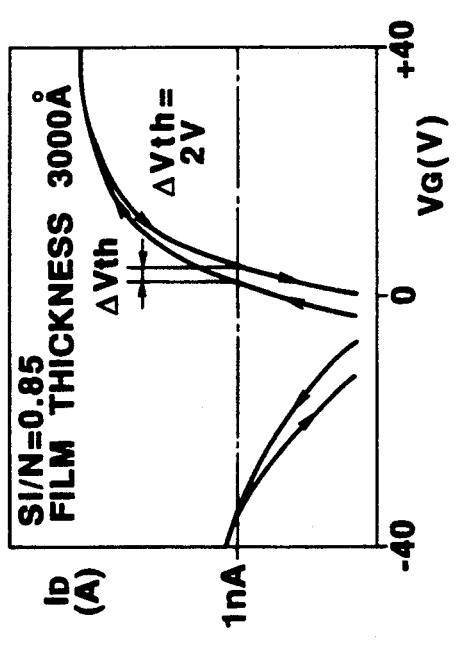

FIGS. 4A to 4D show the result of measurement (made by setting the drain voltage $V_D$ at 10 V and the source voltage $V_S$ at 0 V) of the $V_G$-$I_D$ characteristic of the thin film transistor with the film thickness of the gate insulation film 3 set at 3000 angstrom in a case where the SiN composition ratio of the gate insulation film 3 is changed. FIG. 4A shows the characteristic in the case of Si/N=0.75, FIG. 4B shows the characteristic in the case of Si/N=0.85, FIG. 4C shows the characteristic in the case of Si/N=1.0 and FIG. 4D shows the characteristic in the case of Si/N=1.1.

As shown in FIGS. 4A to 4D, the degree of delta Vth of the hysteresis of the $V_G$-$I_D$ characteristic in the case of the gate insulation film having the film thickness of 3000 angstrom is smaller than that of the $V_G$-$I_D$ characteristic in the case of the gate insulation film having the film thickness of 2000 angstrom shown in FIGS. 3A to 3D even if the composition ratio of Si to N is set at any value. However, if the Si/N composition ratio is set at 1.0, a large hysteresis as shown in FIG. 4C can be attained even when the film thickness is set at 3000 angstrom. The degree of delta Vth of the hysteresis shown in FIG. 4C is 16 V. If the degree of delta Vth of the hysteresis is not less than 15 V, the thin film transistor can have a practically sufficient memory function. Therefore, the thin film transistor having the film thickness of 3000 angstrom and the SiN composition ratio of 1.0 can be used as a memory element such as an $E^{2-}$ PROM. Delta Vth=0.5 V in FIG. 4A, delta Vth=2 V in FIG. 4B and delta Vth=12 V in FIG. 4D. The degree of the hysteresis of FIG. 4D is relatively large.

Figure 5:
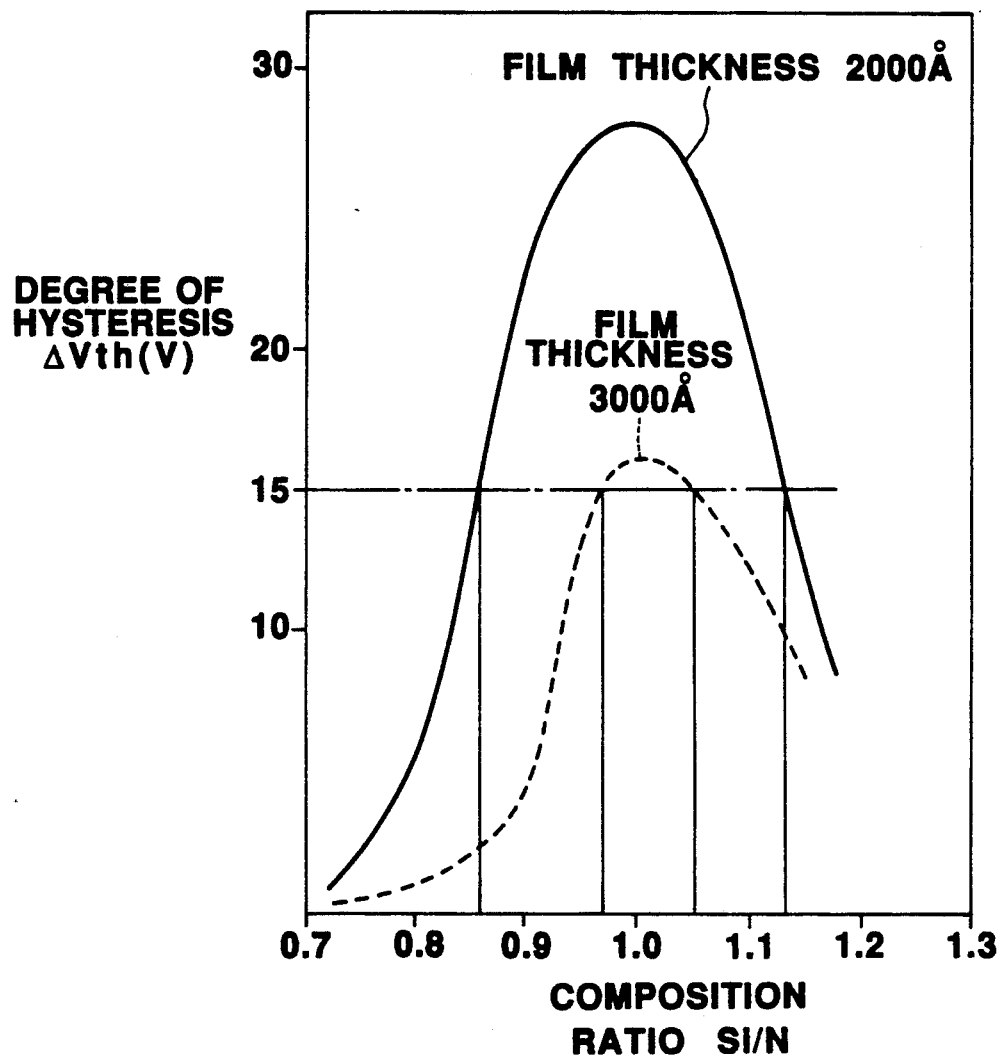
FIG. 5 shows the relation between the degree of hysteresis and the composition ratio of Si/N of the gate insulation film of each of the thin film transistors in a case where the gate insulation films are formed to have thicknesses of 2000 and 3000 angstrom.

FIG. 5 shows the relation between the SiN composition ratio of the SiN film and the degree of delta Vth of the hysteresis in cases where the film thickness of the gate insulation film (SiN film) 3 is set at 2000 and 3000 angstrom. FIG. 5 shows the result of measurement of delta Vth at which a circuit of 1 nA flows between the source and drain when the gate voltage $V_G$ is set at ±40 V, the drain voltage is set at 10 V and the source voltage is set at 0 V. As is understood from FIG. 5, the hysteresis becomes largest when the composition ratio of Si to N is set at or near 1.0 irrespective of whether the film thickness of the SiN film 3 is set at 2000 or 3000 angstrom. As described before, when the degree of delta Vth of the hysteresis is larger than 15 V, the thin film transistor can have a practically sufficient memory function. Therefore, if the film thickness of the SiN film is set at 2000 angstrom, the composition ratio of Si to N may be set between approx. 0.85 and 1.1. Further, if the film thickness of the SiN film is set at 3000 angstrom, the composition ratio of Si to N may be set at approx. 1.0.

If the film thickness of the gate insulation film (SiN film) 3 is set to be less than 2000 angstrom, the range of the composition ratio of Si to N can be set wider than that of approx. 0.85 to 1.1. However, if the film thickness of the gate insulation film 3 is set to be less than 2000 angstrom, the withstanding voltage of the insulation film is lowered. Therefore, it is preferable to set the film thickness of the gate insulation film 3 within the range of 2000 to 3000 angstrom.

In the above embodiment, the inverted stagger type thin film transistor is explained. This invention can also be applied to the stagger type, coplanar type and the inverted coplanar type thin film transistor. In this case, if the ratio of Si to N of the gate insulation film 3 is set in the range of approx. 0.85 to 1.1 and the film thickness of the gate insulation film (SiN film) 3 is set such that the degree of delta Vth of the hysteresis is more than 15 V, then the thin film transistor may have the memory function.

Figure 6:
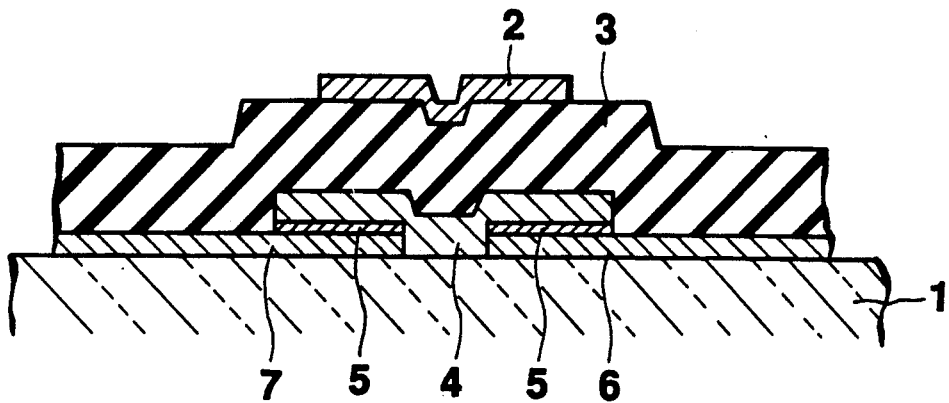
FIGS. 6 to 8 are cross sectional views showing the structures of applications of the thin film transistor used for a memory and according to the first embodiment.
Figure 7:
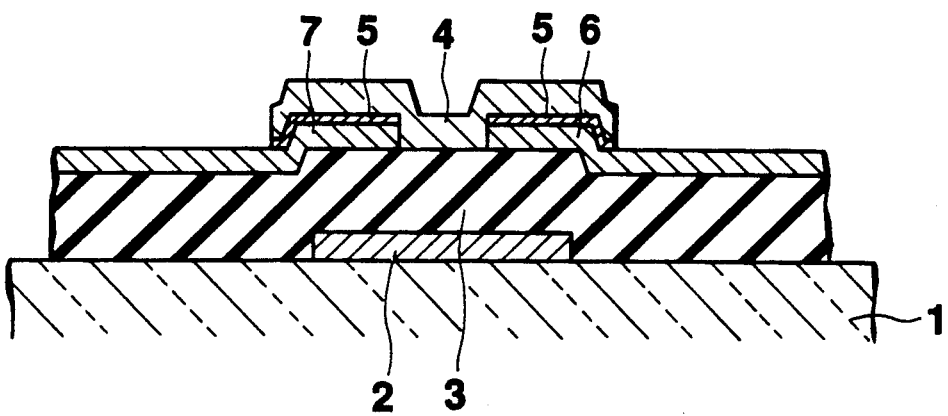
Figure 8:
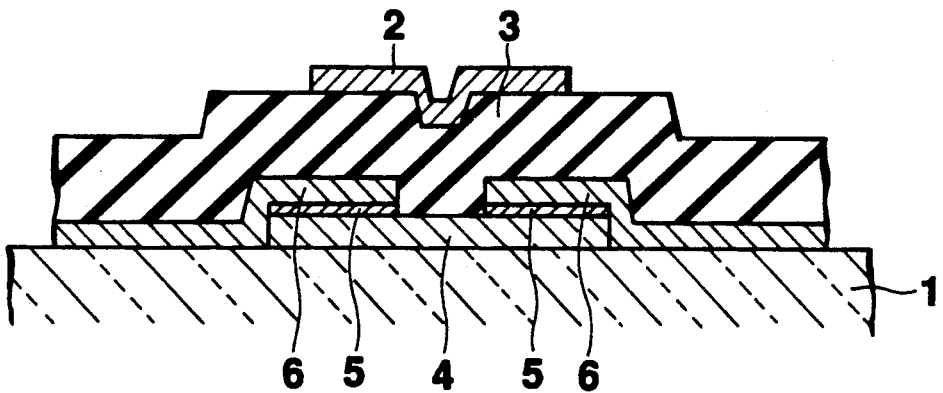

FIG. 6 shows an embodiment in which this invention is applied to a stagger type thin film transistor, FIG. 7 shows an embodiment in which this invention is applied to an inverted coplanar type thin film transistor and FIG. 8 shows an embodiment in which this invention is applied to a coplanar type thin film transistor. The thin film transistors shown in FIGS. 6 to 8 are similar to the inverted stagger type thin film transistor shown in FIG. 1A except the laminated structure of the respective layers constituting the transistor. Therefore, the same reference numerals are attached to corresponding portions of the transistors and the explanation for the structure of FIGS. 6 to 8 is omitted.

As described above, the thin film transistors of the above embodiments can be used as a memory element since the gate insulation film is formed of an SiN film with the composition ratio Si/N of silicon atoms Si to nitrogen atoms N lying in the range of approx. 0.85 to 1.1.

In a case where the semiconductor layer 4 is formed of intrinsic silicon, the transistor is operated in a p-channel operation mode when a negative voltage of approx −15 V to −17 V is applied to the gate electrode 2, and the drain current $I_D$ abruptly increases as shown in FIGS. 2A to 2D and FIGS. 3A to 3D.

In order to solve the above problem, a small amount of impurity may be doped into the semiconductor layer 4.

With this structure, the gate voltage which may cause the thin film transistor to be operated in the p- or n-channel operation mode can be shifted. In this way, the thin film transistor with the memory function can be easily controlled.

The semiconductor layer 4 is not necessarily formed of amorphous silicon and can be formed of the other semiconductor material such as polycrystalline silicon, monocrystalline silicon or germanium.

Second Embodiment

In the thin film memory element of the first embodiment, the gate insulation film 3 is formed of an SiN film having the ratio Si/N=0.85 to 1.15. However, the SiN film having Si/N=0.85 to 1.15 has an electrical resistance lower than that of the SiN film having the stoichiometric ratio of Si/N (Si/N=0.75). For this reason, a leak current may easily flow between the gate electrode 2 and the source and drain electrodes 6 and 7 of the thin film memory element in the first embodiment. Further, charges injected from the semiconductor layer 4 into the gate insulation film 3 and trapped therein may tend to be discharged into the gate electrode 2. In this embodiment, a memory element is constituted by a thin film transistor in which the degree of delta Vth of the hysteresis is increased and a leak current between the gate electrode and the source and drain electrodes is suppressed to a small value.

In this embodiment, the gate insulation film is formed with two-layered structure. The two-layered film includes a non-memory insulation film having no charge storage function provided on the gate electrode and a memory insulation film having a charge storage function provided on the semiconductor layer.

Figure 10:
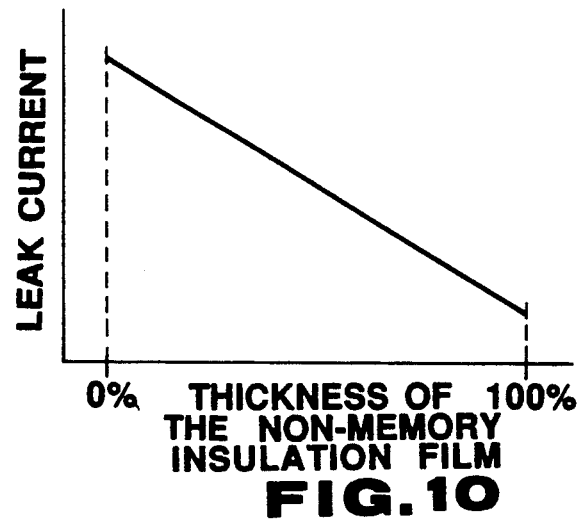
FIGS. 10 and 11 are graphs respectively showing the relation between the film thickness of a non-memory insulation film of the thin film transistor of FIG. 10 and the leak current and that between the film thickness and the hysteresis width.
Figure 11:
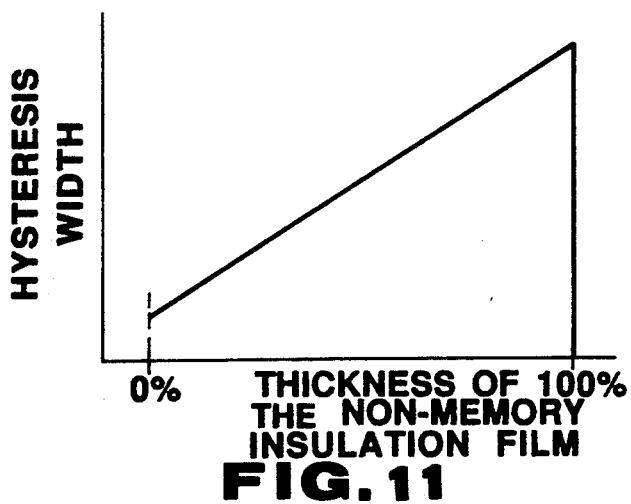

Now, the second embodiment is explained in detail with reference to FIGS. 9 to 11.

Figure 9:
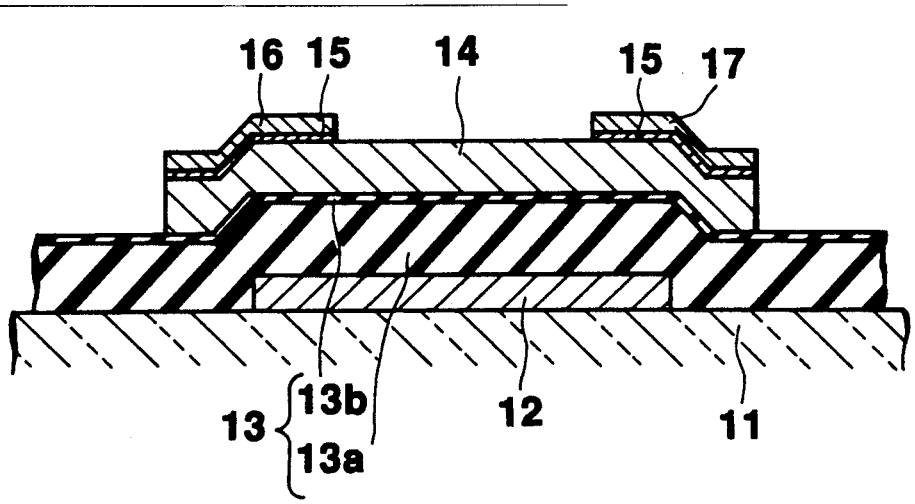
FIG. 9 is a cross sectional view showing the structure of a thin film transistor constituting a memory and according to a second embodiment of this invention.

FIG. 9 is a cross sectional view of a thin film memory element utilizing an inverted stagger type thin film transistor of this embodiment. The thin film memory element is formed of an inverted stagger type thin film transistor having the memory function and formed on an insulation substrate 11 formed of glass or the like. The inverted stagger type thin film transistor includes a gate electrode 12 formed on the insulation substrate 11, a gate insulation film 13 of SiN formed with two-layered structure and formed on the gate insulation film 12, a semiconductor layer 14 of i-a-Si formed on the gate insulation film 13, an n-type a-Si layer 15 formed on the semiconductor layer 14, and source and drain electrodes 16 and 17 formed on the n-type a-Si layer 15. Unlike the structure shown in FIG. 1A, in the structure shown in FIG. 9, the peripheral portion of the semiconductor layer 14 is formed flush with the electrodes 16 and 17. The gate electrode 12 and the source and drain electrodes 16 and 17 are connected to wirings (not shown).

The gate insulation film 13 is formed of a two-layered film including a non-memory insulation film 13a having no charge storage function and a memory insulation film 13b having a charge storage function and formed on the insulation film 13a. The non-memory insulation film 13a is formed of an SiN film having the composition ratio Si/N of silicon atoms Si to nitrogen atoms N set near the stoichiometric ratio [Si/N=0.75] and the memory insulation film 13b is formed of an SiN film having the composition ratio Si/N=0.85 to 1.15. The film thickness of the insulation film 13a is set to 2000 angstrom and that of the insulation film 13b is set to 100 angstrom.

The above thin film memory element is formed as follows. First, a metal film of chromium (Cr) or the like is formed to a thickness of 1000 angstrom on the insulation substrate 11 and is patterned by the photoetching process (PEP), for example, so as to form a gate electrode 12. Then, a non-memory insulation film 13a, a memory insulation film 13b, an i-type a-Si semiconductor layer 14 and an n-type a-Si layer 15 are sequentially deposited on the resultant structure. The i-type a-Si semiconductor layer 14 is formed with a thickness of approx. 1500 angstrom and the n-type a-Si layer 15 is formed with a thickness of approx. 250 angstrom. The deposition of the insulation films 13a and 13b, i-type a-Si layer 14 and n-type a-Si layer 15 is effected by use of the plasma CVD method. The deposition of the insulation film 13a is effected by selectively setting the flow rate ratio of SiH4 to NH3 used as the main component gases in the process such that the composition ratio Si/N of the SiN film to be deposited on the substrate 11 is set near the stoichiometric ratio (Si/N=0.75). The deposition of the insulation film 13b is effected by selectively setting the flow rate ratio of SiH4 to NH3 such that the composition ratio Si/N of the SiN film to be deposited is set in the composition ratio range of 0.85 to 1.15. Further, the deposition of the i-type a-Si semiconductor layer 14 is effected by using SiH4 as the main component gas and the n-type a-Si layer 15 is deposited by introducing PH3 as n-type impurity gas into the SiH4 gas at a predetermined flow rate. Then, a metal film of Cr or the like is deposited on the n-type a-Si layer 15 to a thickness of approx. 500 angstrom by the sputtering method or the like. The metal film is patterned by the PEP method to form source and drain electrodes 16 and 17. Then, the n-type a-Si layer 15 is etched out with the source and drain electrodes 16 and 17 used as a mask. Further, the peripheral portion of the i-type a-Si semiconductor layer 14 is patterned to be flush with source and drain electrodes 16 and 17, thus completing a thin film memory element.

In the thin film memory element, charges are trapped in an interface of the gate insulation film 13 and the semiconductor layer 14 or in the gate insulation film 13 by an electric field from the gate electrode 12. Therefore, even when the gate insulation film 13 is formed with the two-layered structure as described above, the thin film transistor may have the memory function (hysteresis characteristic) if the semiconductor layer 14 is formed in contact with the memory insulation film 13b. Further, in FIG. 9, the memory insulation film 13a is formed to be thicker than the memory insulation film 13b. As a result, the degree of delta Vth of the hysteresis can be increased and a leak current can be reduced.

This effect is explained with reference to FIGS. 10 and 11. FIGS. 10 and 11 show the result of measuring the leak current and the hysteresis widths when the thickness of the gate insulation film 13 (the sum of the thicknesses of the insulation films 13a and 13b) is kept constant and the ratio of the thickness of the memory insulation film 13b to the thickness of the gate insulation film 13 is changed. In the thin film memory element having a gate insulation film (the gate insulation film only of the memory insulation film 13b) in which the ratio of the film thickness of the non-memory insulation film 13a is 0%, a leak current is large and the hysteresis width is small. On the other hand, the leak current becomes smaller as shown in FIG. 10 and hysteresis width becomes larger as shown in FIG. 11 as the film thickness ratio of the non-memory insulation film 13a becomes larger. Further, if the memory insulation film 13b is removed and the film thickness ratio of the non-memory insulation film 13a is set to 100%, then the hysteresis width delta Vth becomes substantially 0, preventing the transistor from operating as a memory. Therefore, if the non-memory insulation film 13a is formed to be thicker than the memory insulation film 13b, it becomes possible to reduce the leak current and increase the hysteresis width. For example, if the film thickness of the non-memory insulation film 13a is set to 2000 angstrom and the film thickness of the memory insulation film 13b is set to 100 angstrom as in the above embodiment, a thin film memory in which substantially no leak current flows and the hysteresis width is sufficiently large can be obtained.

Third Embodiment

In the above embodiments, the composition ratio Si/N of the gate insulation film 3 is set to 0.85 to 1.1. However, even if the composition ratio Si/N is less than 0.85, for example, 0.75, the electric field applied to the gate insulation film 3 becomes larger when the film thickness is made smaller so that the gate insulation film 3 may have a function of trapping charge. In this way, the degree of delta Vth of the hysteresis can be increased. However, if the gate insulation film 3 is made thin, the withstanding voltage of the gate insulation film 3 is lowered and the transistor may be broken down.

In this embodiment, a thin film transistor having an excellent memory function without lowering the withstanding voltage of the gate insulation film can be provided. The gate insulation film of the thin film transistor of this embodiment is formed of a ferroelectric film formed in contact with the gate electrode and a silicon nitride film formed in contact with the semiconductor layer.

Now, the third embodiment is explained in detail with reference to FIG. 12.

Figure 12:
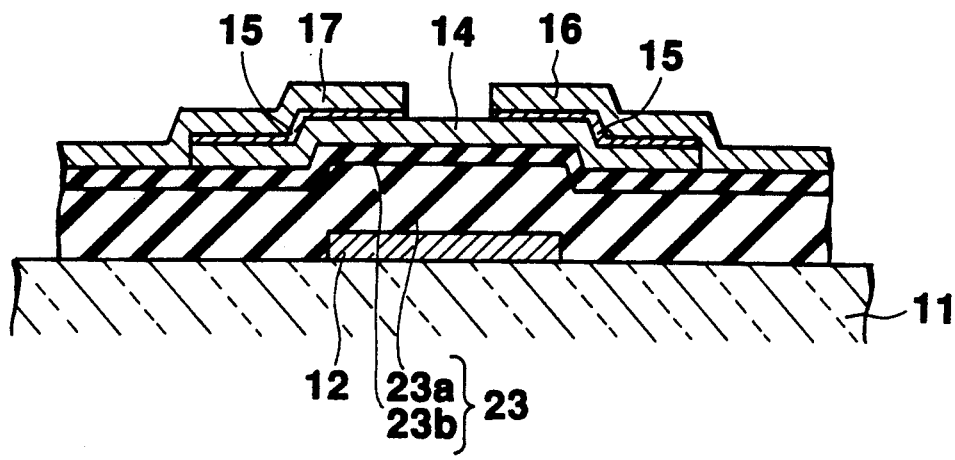
FIG. 12 is a cross sectional view showing the structure of a thin film transistor having a memory function according to a third embodiment of this invention.

FIG. 12 is a cross sectional view showing an example of the thin film transistor with the memory function of this embodiment. In FIG. 12, a gate electrode 12 of chromium (Cr) or the like is formed on an insulation substrate 11 of glass, for example. A gate insulation film 23 is formed on the gate electrode 12. A semiconductor layer 14 formed of i-type amorphous silicon (i-a-Si) and further, n+-type semiconductor layers 15 are formed on the i-type semiconductor layer 14. The channel portion of the n-type semiconductor layer 15 is removed. Source and drain electrodes 16 and 17 of chromium or the like are formed on the n+-type semiconductor layers 15. The gate electrode 12, and the source and drain electrodes 16 and 17 are connected to wirings (not shown).

The gate insulation film 23 is formed of a ferroelectric film 23a formed in contact with the gate electrode 12 and a silicon nitride (SiN) film 23b formed in contact with the semiconductor layer 14. The ferroelectric film 23a is formed of a dielectric material such as tantalum oxide (TaOx) having a dielectric constant not less than 10. In this embodiment, Ta$_2$O$_3$ is used as the tantalum oxide and a Ta$_2$O$_3$ film with a thickness of 3000 angstrom is formed. The dielectric constant of Ta$_2$O$_3$ is approx. 25. The silicon nitride film 23b is formed of silicon nitride (Si$_3$N$_4$) having the composition ratio Si/N of silicon atoms Si to nitrogen atoms N substantially equal to the stoichiometric ratio (Si/N=0.75). Further, the silicon nitride film 23b is formed to a thickness of 250 angstrom. The dielectric constant of the silicon nitride film 23b is 7.1.

Now, the operation of the thin film transistor of this embodiment is explained. In a thin film transistor having a gate insulation film formed of a single film of silicon nitride, the intensity of an electric field applied to the gate insulation film when the gate voltage $V_G$ is 40 V is 1.3 MV/cm (in this case, the film thickness of the gate insulation film is 3000 angstrom). However, in the thin film transistor of this embodiment, the intensity of an electric field applied to the gate insulation film 23b when the gate voltage $V_G$ is 40 V is 3.5 MV/cm.

The degree of delta Vth of the hysteresis increases with an increase in the intensity of the electric field applied to the silicon nitride film 23b. Therefore, according to the thin film transistor with the memory function of this embodiment, the operation margin or delta Vth can be increased without raising the gate voltage $V_G$.

In the above explanation, the ferroelectric film (Ta$_2$O$_3$) 23a is formed to a thickness of 3000 angstrom. However, if the ferroelectric film 23a is formed thinner, the intensity of the electric field applied to the silicon nitride film 23b can be increased. In this case, if the ferroelectric film 23a is made too thin, the withstanding voltage of the transistor is lowered. In contrast, if the ferroelectric film 23a is made too thick, then the electric field applied to the silicon nitride film 23b becomes weak. Therefore, it is preferable to set the film thickness of the ferroelectric film 23a in a range of 1000 to 3000 angstrom. Further, the ferroelectric film 23a is not limited to tantalum oxide but can be formed of any dielectric material having a dielectric constant equal to or larger than 10. In this embodiment, the film thickness of the silicon nitride film 23b is set to 250 angstrom, but can be selected from a range of 50 to 2000 angstrom (preferably 50 to 1000 angstrom). When the film thickness of the silicon nitride film 23b is set in the above range, the silicon nitride film 23b may have a sufficiently large charge trapping ability and can be used as a memory element.

With the construction of this embodiment, a relatively strong electric field is applied to the silicon nitride, and therefore it is not necessary to set the composition ratio Si/N of the silicon nitride film 23b in a range of 0.85 to 1.1. However, if the composition ratio Si/N of the silicon nitride film 23b is set in the range of 0.85 to 1.1 a more effective memory function can be attained.

Figure 13:
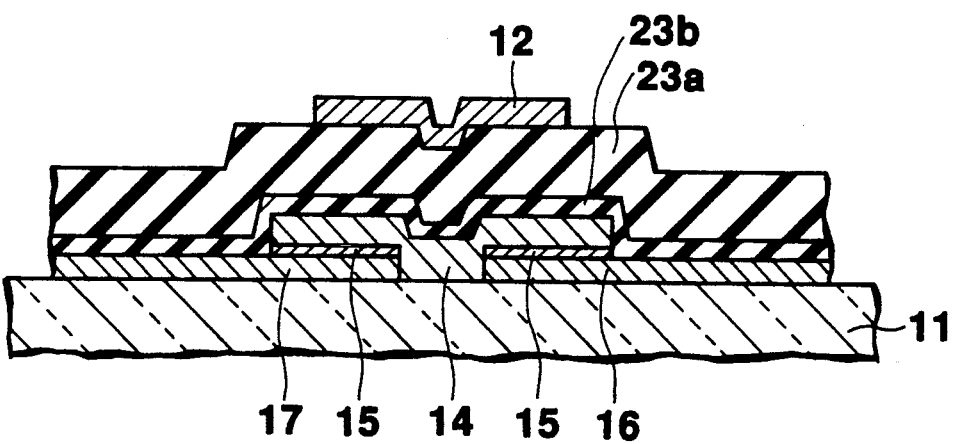
FIGS. 13 to 15 are cross sectional views of applications of the third embodiment of this invention.
Figure 14:
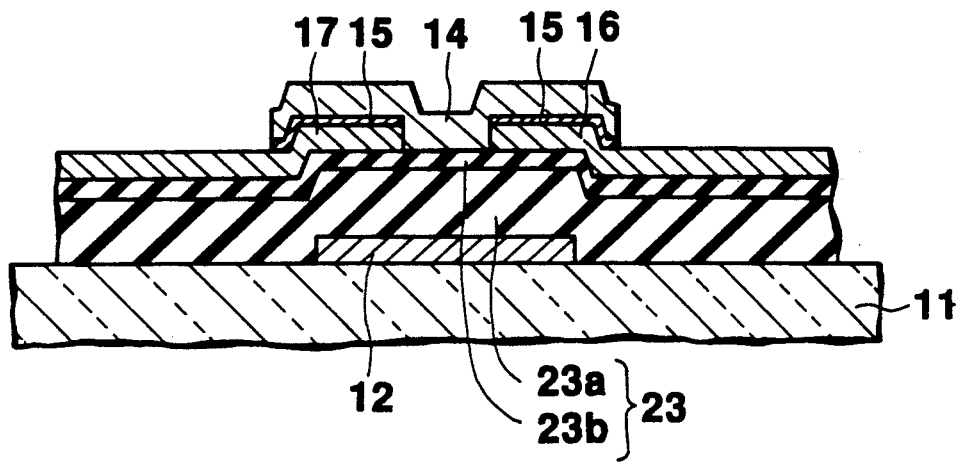
Figure 15:
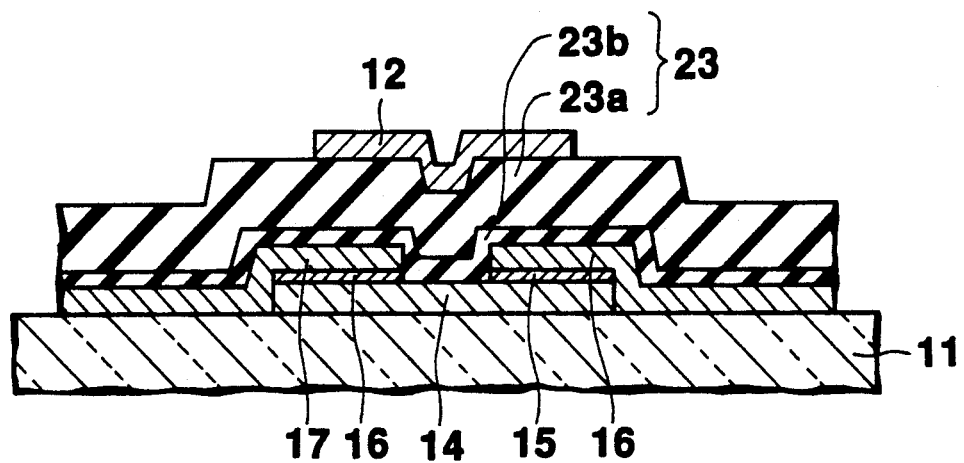

The construction of this embodiment can also be applied to the stagger type, inverted coplanar type and coplanar type thin film transistors. In this case, the gate insulation film is formed with a two-layered film having a ferroelectric film provided on the gate electrode and a silicon nitride film provided on the semiconductor layer. FIG. 13 shows an example in which this embodiment is applied to the stagger type thin film transistor, FIG. 14 shows an example in which this embodiment is applied to the inverted coplanar type thin film transistor, and FIG. 15 shows an example in which this embodiment is applied to the coplanar type thin film transistor. The thin film transistors with the memory function shown in FIGS. 13 to 15 are similar in the basic construction to the thin film transistor of FIG. 12 except the laminated structure of the layers constituting the transistor, and therefore, the same reference numerals are attached to corresponding portions of the transistors and the explanation for the structure of FIGS. 13 to 15 is omitted.

As described above, in this embodiment, the silicon nitride film 23b is made thin and is formed to have a charge trapping function and the ferroelectric film 23a is formed to provide a high withstanding voltage for the gate insulation film 23. In this way, the operation margin of the memory element can be increased without lowering the withstanding voltage of the gate insulation film 23. For example, if the ferroelectric film is formed with a film thickness of 1000 to 5000 angstrom and a dielectric constant of not less than 10, a sufficiently high withstanding voltage can be attained by the ferroelectric film. Further, if the silicon nitride film is formed with a film thickness of 50 to 2000 angstrom, then the silicon nitride film can have a sufficiently large charge trapping ability and can be used as a memory element. For example, the ferroelectric film can be formed of tantalum oxide. Since the dielectric constant of tantalum oxide is large, it becomes easy to obtain a high withstanding voltage for the gate insulation film.

Fourth Embodiment

In this embodiment, a thin film transistor in which the degree of delta Vth of the hysteresis is large and which can be preferably used as a memory element is provided.

In this embodiment, a semiconductor layer is disposed between the gate electrode and the gate insulation film of the thin film transistor.

Now, the construction of the thin film transistor according to this embodiment is explained with reference to FIGS. 16 and 17.

Figure 16:
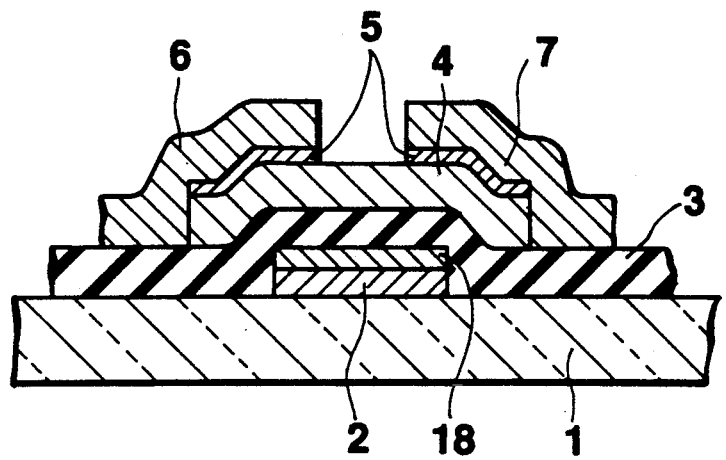
FIG. 16 is a cross sectional view showing the structure of a thin film transistor having a memory function according to a fourth embodiment of this invention.

FIG. 16 is a cross sectional view of the thin film transistor according to this embodiment. The construction of FIG. 16 is similar to that of FIG. 1A except that a second semiconductor layer 18 is disposed between the gate electrode 2 and the gate insulation film 3. The semiconductor layer 18 is formed as follows. First, a metal layer is formed on the substrate 1 and a semiconductor layer of amorphous or polycrystalline silicon is formed to a thickness of 200 angstrom by the plasma CVD method. The metal layer and semiconductor layer are etched out by the photoetching process with the same photoresist film used as a mask so as to form the gate electrode and second semiconductor layer 18.

Figure 17:
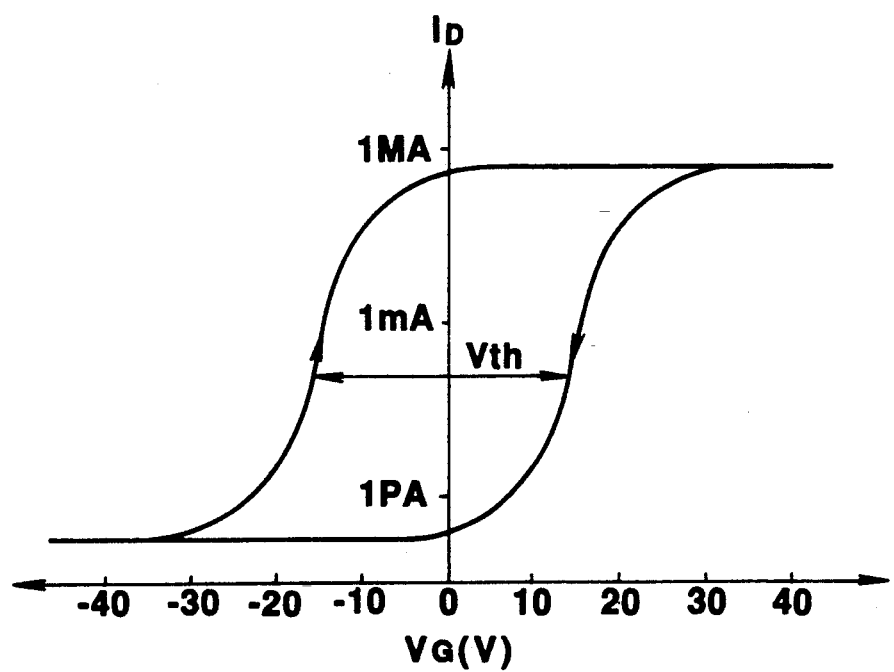
FIG. 17 is a graph showing the characteristic of the thin film transistor with the memory function according to the fourth embodiment.

FIG. 17 shows the $V_G$-$I_D$ characteristic of the thin film transistor with the construction of FIG. 16. As shown in FIG. 17, the degree of delta Vth of the hysteresis in the $V_G$-$I_D$ characteristic of the thin film transistor according to this embodiment is extremely large. The possible reason for the increased degree of delta Vth is that charges are stored in the interface between the gate insulation film 3 and the second semiconductor layer 18 so as to enhance the charge storing ability of the thin film transistor.

As described above, in this embodiment, the hysteresis of the $V_G$-$I_D$ characteristic can be made larger and the thin film transistor can be used as a memory element.

The thin film transistor of FIG. 16 is formed with the inverted stagger structure, but this embodiment can be applied to the inverted coplanar type, coplanar type and stagger type thin film transistors. Further, the semiconductor layer 18 can be formed of amorphous silicon, polycrystalline silicon or monocrystalline silicon.

Fifth Embodiment

In the embodiment of FIG. 16, a single semiconductor layer is additionally provided. However, this invention is not limited to this. For example, it is possible to additionally provide a plurality of semiconductor layers in the thin film transistor as shown in FIG. 18.

Figure 18:
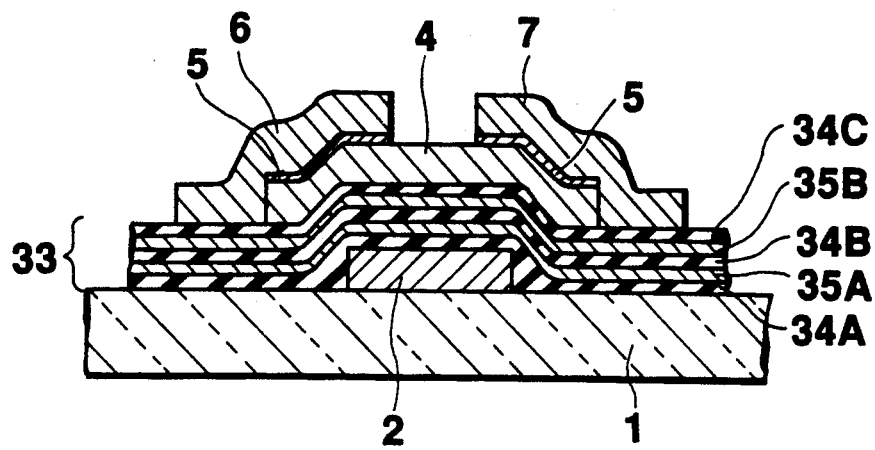
FIG. 18 is a cross sectional view showing the structure of a thin film transistor having a memory function according to a fifth embodiment of this invention.

In FIG. 18, a gate electrode 2 of metal such as chromium is formed to a thickness of 1000 angstrom on an insulation substrate 1. A gate insulation layer 33 is formed to a thickness of 2500 angstrom on the gate electrode 2 so as to insulatively cover the gate electrode 2. The insulation layer 33 is formed with a laminated structure of silicon nitride films 34A to 34C and amorphous silicon (semiconductor) films 35A and 35B which are alternately arranged. Each of the films is formed to a thickness of approx. 500 angstrom by the plasma CVD method or the like. The lamination order can be reversed and the number of laminated films is not limited to 5. A semiconductor layer 4, n-type semiconductor layer 5, and source and drain electrodes 6 and 7 are formed on the gate insulation layer 33. As in the case of the embodiment of FIG. 17, the degree of delta Vth of the hysteresis in the $V_G$-$I_D$ characteristic of the thin film transistor according to this embodiment is large enough. Therefore, the thin film transistor of this embodiment can be used as a memory element.

The same effect can be attained by using polycrystalline silicon layers or monocrystalline silicon layers instead of the amorphous silicon layers 35A and 35B. In the above embodiment, the inverted stagger type thin film transistor is shown, but this embodiment can also be applied to inverted coplanar type, coplanar type and stagger type thin film transistors.

Sixth Embodiment

When the gate insulation film 3 is formed by the $CV_D$ method, the composition ratio (Si/N) of deposited silicon nitride may vary depending on variation in the interface condition of the deposited surface (the surface of the substrate 1 and the surface of the gate electrode 2) of silicon nitride and variation in the substrate temperature. For this reason, the charge trapping abilities of different portions of the gate insulation film thus formed may vary from each other, causing variation in the memory characteristic of the transistor.

In this embodiment, a thin film transistor having an adequate (little variation) charge trapping function is provided. In this embodiment, the composition ratio of silicon atoms to nitrogen atoms of the gate insulation film is changed in a thickness direction thereof and the composition ratio Si/N of a partial area of the gate insulation film in the thickness direction is set to 1.0.

Now, the thin film transistor with the memory function is explained in detail with reference to FIGS. 19A to 22.

Figure 19A:
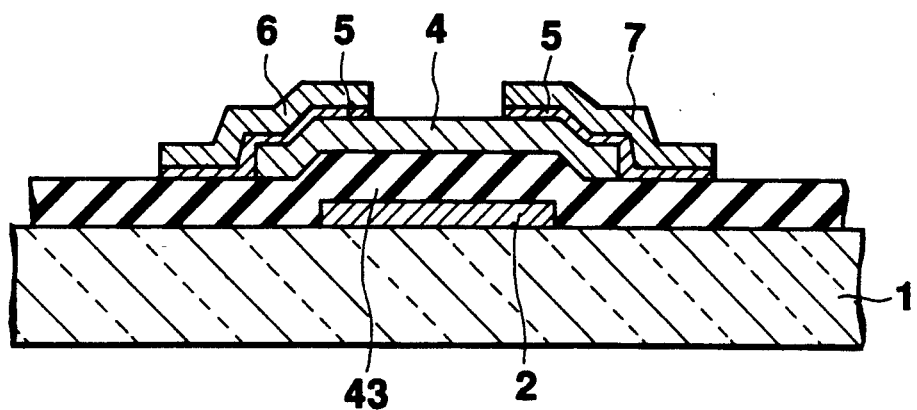
FIG. 19A is a cross sectional view of a thin film transistor according to a sixth embodiment of this invention.
Figure 19B:
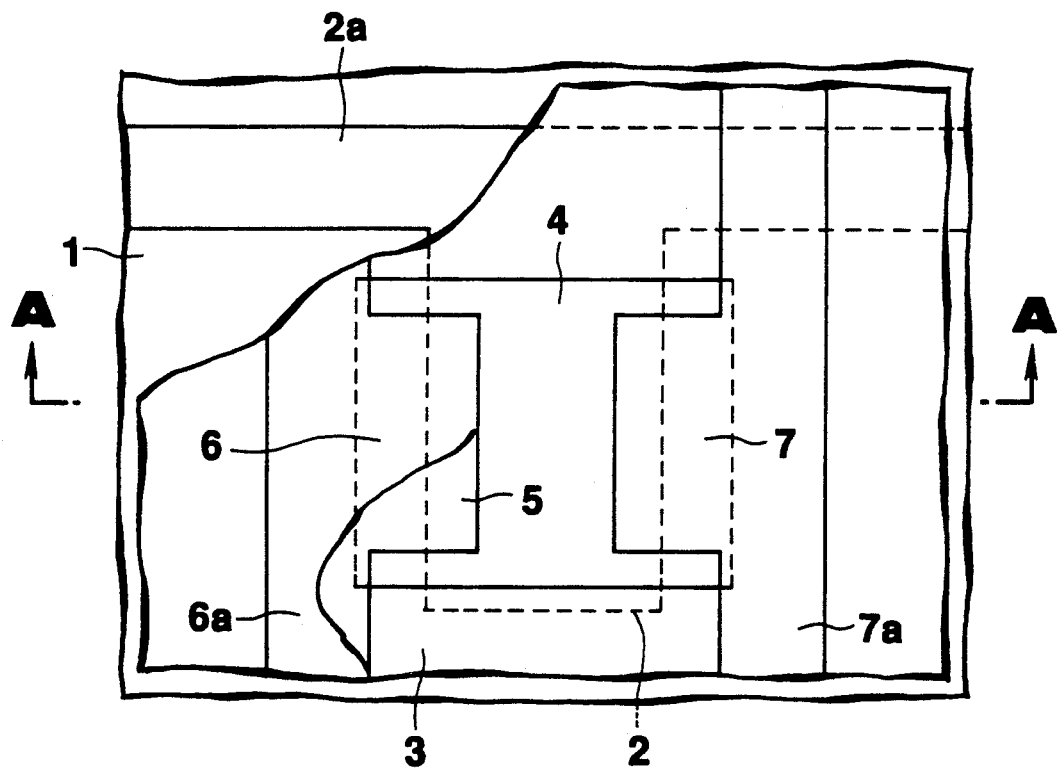
FIG. 19B is a plan view of the thin film transistor of the sixth embodiment.

FIG. 19A and 19B are cross sectional and plan views of the thin film transistor with the memory function according to this embodiment. In order to attain the thin film transistor of this construction, a gate electrode 2 is formed on an insulation substrate 1 of glass, for example. Then, a gate insulation film 43 is formed on the gate electrode 2 and an i-type amorphous silicon layer 4 is formed on the gate insulation film 43. An n-type amorphous silicon layer 5 and source and drain electrodes 6 and 7 are formed on the i-type semiconductor layer 4. As shown in FIG. 19B, the gate electrode 2 is connected to a gate line 2a and the source and drain electrodes 6 and 7 are respectively connected to source and drain lines 6a and 7a.

The gate insulation film 43 is formed of silicon nitride (SiN) and with a film thickness of approx. 2000 angstrom. The composition ratio (Si/N) of silicon atoms Si to nitrogen atoms N varies in a direction of the gate insulation film 3 and the composition ratio Si/N of a partial area (layer) of the gate insulation film 43 is set to 1.0.

Figure 20:
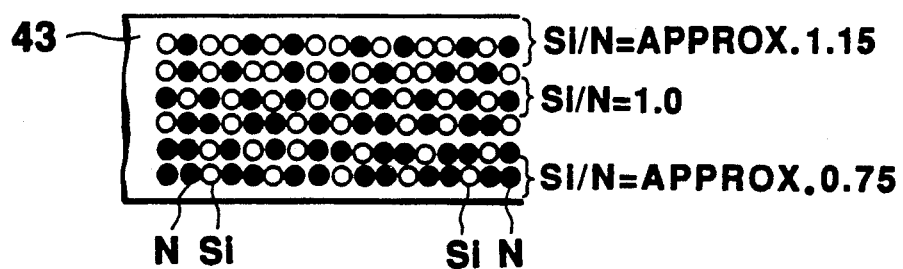
FIG. 20 is a view showing a model of the structure of a gate insulation film of the thin film transistor according to the sixth embodiment.

FIG. 20 is a model diagram showing the distribution of silicon atoms Si and nitrogen atoms N of the gate insulation film 43. The composition ratio Si/N of silicon atoms Si to nitrogen atoms N of the gate insulation film 43 varies from approx. 0.75 to 1.15 in a direction from the gate electrode 2 (lower side in FIG. 20) to the i-type semiconductor layer 4 (upper side in FIG. 20). The area in which Si/N=1.0 lies in a position slightly deviated from the central position to the i-type semiconductor layer 4.

FIGS. 21A to 21D show the manufacturing process of the thin film transistor with the memory function according to this embodiment. The manufacturing process is explained below.

Figure 21A:
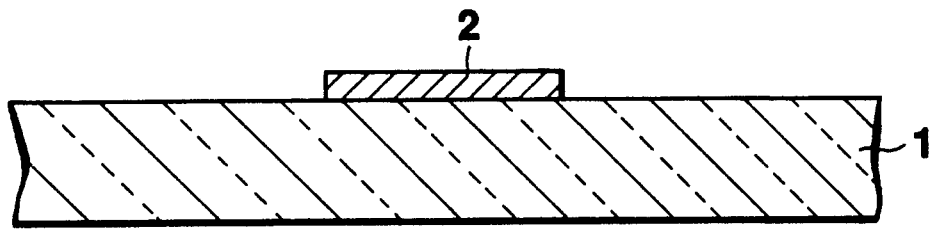
FIGS. 21A to 21D are cross sectional diagrams showing the manufacturing process of the thin film transistor according to the sixth embodiment.

As shown in FIG. 21A, the gate electrode 2 and gate line 2a are formed on the insulation substrate 1. The gate electrode 2 and gate line 2a are formed by depositing metal such as chromium (Cr) on the substrate 1 to a thickness of 1000 angstrom by the vapor deposition method, sputtering method or the like and then patterning the metal film by the photolithographic method. After this, the gate insulation film 43 of silicon nitride is formed to a thickness of 2000 angstrom on the resultant structure. Then, the semiconductor layer 4 is formed to a thickness of 1500 angstrom on the gate insulation film 43, thus completing the semiconductor structure shown in FIG. 21B.

The deposition of silicon nitride by the CVD method is effected while the flow rate of silicon gas $SiH_4$ is continuously increased and the flow rate of ammonia gas $NH_3$ is continuously decreased with the total sum of the flow rate of silane gas $SiH_4$ and ammonia gas $NH_3$ kept constant. In this case, the flow rate of silane gas $SiH_4$ ($SiH_4$ [SCCM] (Standard Cubic Centimeter per Minute)) and the flow rate of ammonia gas $NH_3$ ($NH_3$ [SCCM]) are so selected that the ratio of $SiH_4$ [SCCM] to $NH_3$ [SCCM] will be set to substantially 1:2 in the initial period of deposition of silicon nitride and the ratio of $SiH_4$ [SCCM] to $NH_3$ [SCCM] will be set to substantially 1:1 in the end of the deposition.

When silicon nitride is deposited while the flow rate ratio ($SiH_4$ [SCCM]/$NH_3$ [SCCM]) of silane gas $SiH_4$ to ammonia gas $NH_3$ is continuously changed with time, the composition ratio of silicon atoms Si to nitrogen atoms N in a film thickness direction of the gate insulation film 43 formed by the deposition is continuously changed. Further, the composition ratio Si/N of the initially deposited SiN is approx. 0.75 and the composition ratio Si/N of the finally deposited SiN is approx. 1.15. As a result, a layer (area) whose composition ratio Si/N is 1.0 is provided in part of the film.

Figure 22:
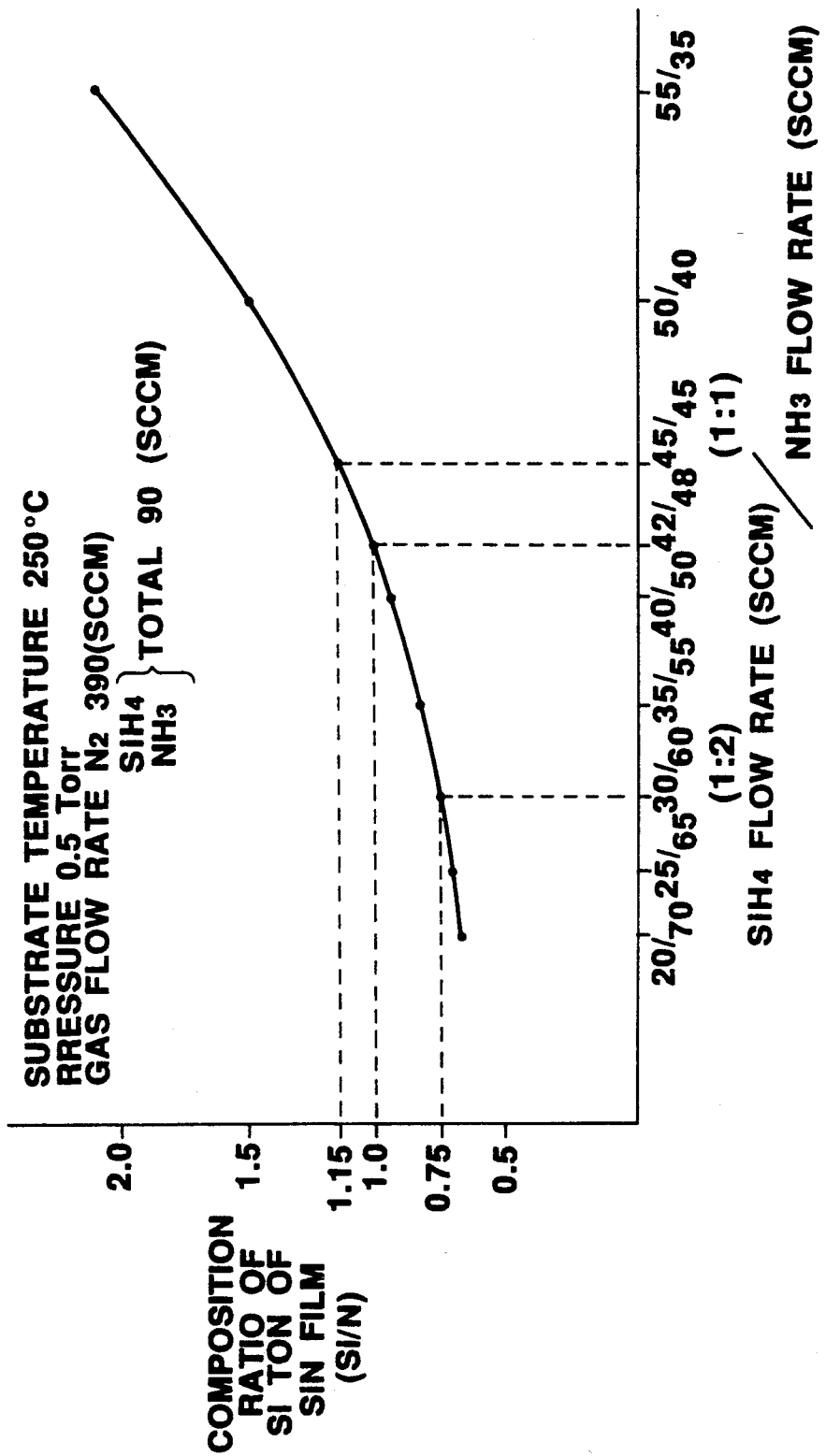
FIG. 22 shows the relation between the flow rate ratio of silane gas $SiH_4$ to ammonia gas $HN_3$ and the composition ratio (Si/N) of silicon atoms Si to nitrogen atoms N in the deposited silicon nitride film.

FIG. 22 shows the result of measurement of the relation between the flow rate ratio ($SiH_4$ [SCCM]/$NH_3$ [SCCM]) of silane gas $SiH_4$ to ammonia gas $NH_3$ and the composition ratio (Si/N) of silicon atoms Si to nitrogen atoms N in the deposited silicon nitride film. FIG. 22 shows the measurement result obtained when silicon nitride is deposited under a condition that the substrate temperature is set at 250° C., the pressure is set at 0.5 Torr, the flow rate of nitrogen gas $N_2$ which is an atmospheric gas is set at 390 [SCCM] (constant), and the total flow rate of silane gas $SiH_4$ and ammonia gas $NH_3$ is set at 90 [SCCM] (constant).

As is clearly seen from FIG. 22, the composition ratio Si/N of the silicon nitride deposited under a condition that the flow rate ratio $SiH_4$ [SCCM]/$NH_3$ [SCCM] of silane gas $SiH_4$ to ammonia gas NH 3 is set to approx. 30/60 ($SiH_4$ [SCCM]:$NH_3$ [SCCM]=1:2) is approx. 0.75. The composition ratio Si/N of the silicon nitride deposited under a condition that $SiH_4$ [SCCM]/$NH_3$ [SCCM] is set to approx. 45/45 ($SiH_4$ [SCCM]:$NH_3$ [SCCM]=1:1) is approx. 0.75. Further, the composition ratio Si/N of the silicon nitride deposited under a condition that the flow rate $SiH_4$ [SCCM]/$NH_3$ [SCCM] is set to approx. 42/48 is approx. 1.0.

Therefore, if silicon nitride is deposited while the flow rate of silane gas $SiH_4$ to ammonia gas $NH_3$ is changed from approx. 1:2 to approx. 1:1, the composition ratio Si/N of a partial area (layer) of the gate insulation film 43 can be set to 1.0 irrespective of variation in the substrate temperature and variation in the interface condition on which silicon nitride is deposited.

The semiconductor layer 4 is formed by deposition after the deposition of the gate insulation film 43 by using a mixed gas of silane and hydrogen by the plasma CVD method.

Figure 21B:
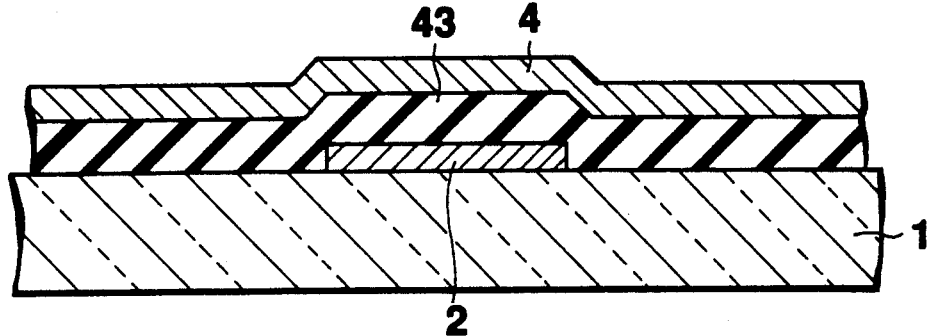
Figure 21C:
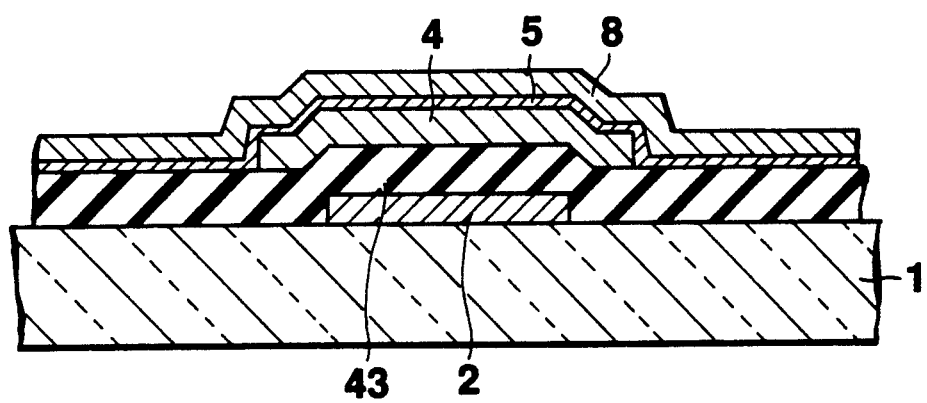

After the semiconductor layer 4 is formed, it is patterned into a shape of the element region by the photolithographic method. Then, an amorphous silicon layer 5 having n-type impurity such as phosphorus (P) doped therein and a metal film 8 of chromium (Cr) or the like which is used as source and drain electrodes are deposited on the resultant structure, thus forming a structure as shown in FIG. 21B. Further, the n-type semiconductor layer 5 is deposited to a thickness of 250 angstrom by using a mixed gas of silane, phosphine and hydrogen by the plasma $CV_D$ method, and the metal film 8 is deposited to a thickness of 1000 angstrom by the vapor deposition method or sputtering method.

Figure 21D:
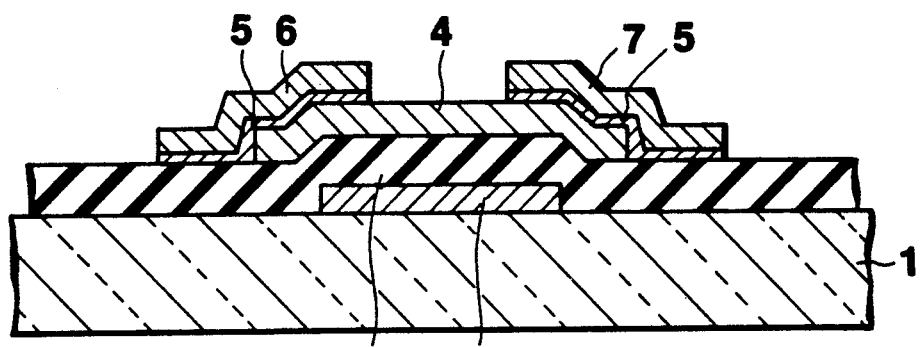

The metal film 8 and n-type semiconductor layer 5 are patterned by the photolithographic method to form the source electrode 6, source line 6a, drain electrode 7 and drain line 7a as shown in FIG. 21D. In this way, a thin film transistor with the memory function as shown in FIGS. 19A and 19B is completed.

In this embodiment, the composition ratio of silicon atoms to nitrogen atoms of the gate insulation film 43 changes in the film thickness direction. Therefore, the composition ratio of a partial layer of the gate insulation film 43 is set to 1.0. The gate insulation film 43 formed of silicon nitride has an optimum charge trapping function in the area whose composition ratio Si/N is set at or near 1.0. Therefore, the thin film transistor of this embodiment has a stable memory function.

In this embodiment, the composition ratio of the area near the gate electrode 2 of the gate insulation film 43 is set near the stoichiometric ratio (Si/N=0.75). The silicon nitride film having Si/N of 0.75 has a high insulation property. That is, in this embodiment, the withstanding voltage of the gate insulation film 43 is high and a leak current flowing between the gate electrode 2 and the source and drain electrodes 6 and 7 is small. Further, if that area of the gate insulation film 43 whose composition ratio Si/N is 1.0 is made thin, the hysteresis of the $V_G$-$I_D$ characteristic becomes large, enhancing the memory function.

Figure 23:
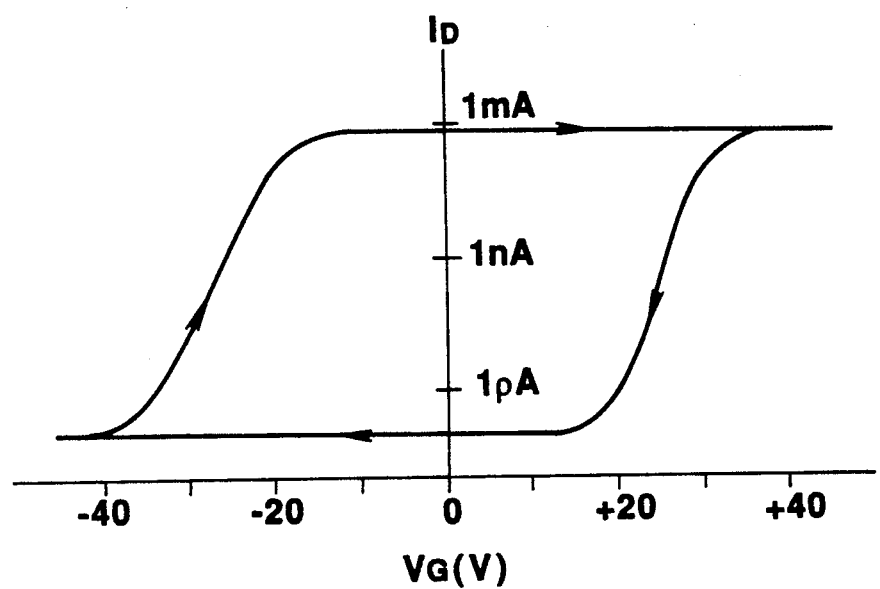
FIG. 23 is a diagram showing the characteristic of the thin film transistor according to the sixth embodiment.

FIG. 23 shows the gate voltage $V_G$-drain current $I_D$ characteristic of the thin film transistor according to this embodiment. The degree of delta Vth of the hysteresis of the thin film transistor with the memory function is as large as approx. 40 V.

In the above explanation, the composition ratio Si/N is changed from 0.75 to 1.15, but it can be changed from 1.15 to 0.75. Further, it is possible to use another composition ratio range such as a range of 0.9 to 1.1.

In the above embodiment, the inverted stagger type thin film transistor with the memory function is explained. However, this embodiment can also be applied to the inverted coplanar type and coplanar type thin film transistors with the memory function.

In the above explanation, each embodiment is separately explained for easy understanding. However, the above embodiments can be combined. For example, the gate insulation film 3 of the thin film transistor of the fourth embodiment shown in FIG. 16 can be formed such that the composition ratio thereof can be continuously changed in the same manner as in the case of the insulation film 43 shown in FIG. 20. Further, the other embodiments can be variously combined.

Figure 24:
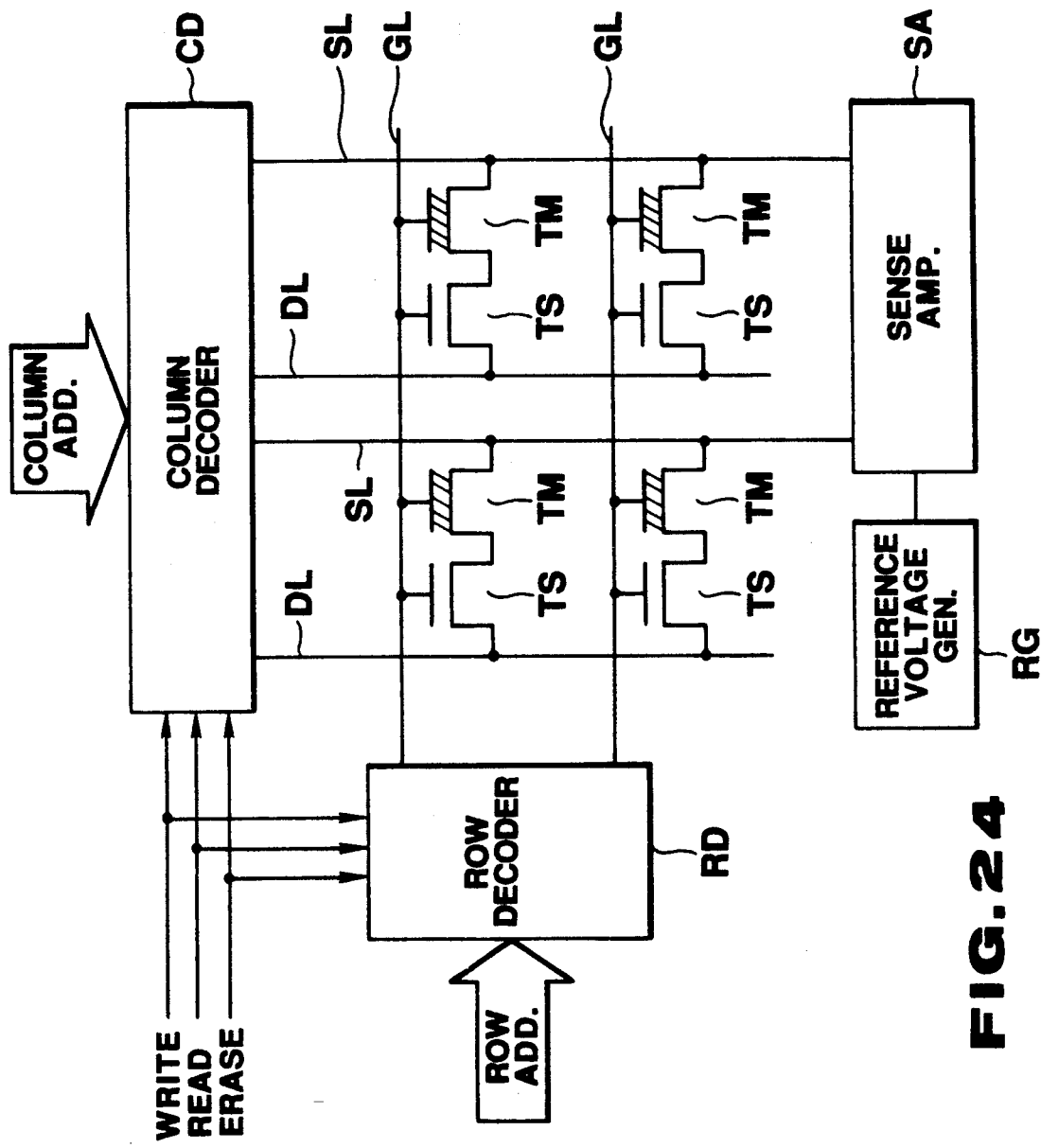
FIGS. 24 and 25 are circuit diagrams of examples of memory circuits using the memory element of this invention.

Next, the construction and operation of a memory circuit using the thin film transistor with the memory function of the above construction is explained with reference to FIG. 24. As shown in FIG. 24, the current path of a transistor TM used as a memory element is series-connected to the current path of a selection transistor TS to form a transistor pair. The selection transistor TS is turned on when a voltage having an absolute value larger than a predetermined value (for example, higher than $+10$ V or lower than $-10$ V) is applied to the gate electrode thereof. A plurality of pairs of the transistors TM and TS are arranged in a matrix form. The gates of the transistors TM and TS on the same row are commonly connected to a corresponding one of gate lines (word line) GL. The current paths of the selection transistors TS on the same column are commonly connected at one end to a corresponding one of drain lines DL. Further, the current paths of the memory transistors TM on the same column are commonly connected at one end to a corresponding one of source lines (bit line) SL.

The gate lines GL are connected to a row decoder RD. The drain lines DL and source lines SL are connected to a column decoder CD. The source lines SL are also connected to a sense amplifier SA. The sense amplifier SA is connected to a reference voltage generating circuit RG. The row decoder RD is supplied with a row address, write-in control signal, readout control signal and erasing command signal. The column decoder CD is supplied with a column address, write-in control signal, readout control signal and erasing command signal.

A) A data write-in process (writing data of logic "1") with the above construction is explained below.

First, a row address and a column address for specifying one of the memory transistors TM into which data is written are supplied to the row decoder RD and the column decoder CD and the write-in signal is set to an active level. The row decoder RD sets the voltage of the gate line GL on the row which is specified by an input signal to Vp/2, for example, and sets voltages of the other gate lines to 0 V. For example, in a case where the gate voltage can be changed in a range of $+40$ V to $-40$ V, Vp/2 is set to 20 V, for example. The column decoder CD sets the voltages of the drain line DL and source line SL on the column selected by the input signal to $-$Vp/2 ($-20$ V), for example, and sets the voltages of the other drain lines and source lines to 0 V. The selection transistor TS is turned on in response to the gate voltage and a voltage of $-$Vp/2 is applied to the source and drain electrodes of the memory transistor. Therefore, a voltage Vp of 40 V is applied between the gate and drain, that is, across the gate insulation film of the memory transistor TM. As a result, charges are trapped in the gate insulation film of the selected memory transistor, thereby completing the operation of writing data "1".

B) Next, the data erasing (writing data of logic "0") method is explained below.

First, a row address and a column address for specifying one of the memory transistors TM having data to be erased are supplied to the row decoder RD and the column decoder CD and the erasing signal is set to an active level. The row decoder RD sets the voltage of the gate line GL on the row which is specified by an input signal to $-$Vp/2, for example, and sets voltages of the other gate lines to 0 V. The column decoder CD sets the voltages of the drain line DL and source line SL on the column selected by the input signal to $+$Vp/2, for example, and sets the voltages of the other drain lines and source lines to 0 V. The selection transistor TS is turned on in response to the gate voltage and a voltage of $+$Vp/2 is applied to the source and drain electrodes of the memory transistor. Therefore, a voltage $-$Vp is applied between the gate and drain of the memory transistor TM. As a result, charges are trapped in the gate insulation film of the selected memory transistor, thereby completing the operation of writing data "0".

C) The operation of reading out data from the memory element is explained below.

First, a row address and a column address for specifying one of the memory transistors TM from which data is read out are supplied to the row decoder RD and the column decoder CD and the readout signal is set to an active level. The row decoder RD sets the voltage of the gate line GL on the row which is specified by an input signal to VON (for example $+10$ V) and sets voltages of the other gate lines to 0 V. The column decoder CD sets the voltage of the drain line DL on the column selected by the input signal to VD (for example, 10 V) and sets the source line SL on the selected column into the electrically floating state. The selected transistors TS and TM are turned on in response to the gate voltage and a current ID flows from the activated drain line into the sense amplifier SA via the transistors TS and TM and the source line SL. The sense amplifier SA compares a voltage caused on the source line SL by the current $I_D$ with a reference voltage from the reference voltage generating circuit RG. The level of the current ID is highly dependent on the polarity of the charge trapped in the memory transistor TM, that is, data stored in the memory transistor TM. As a result, the voltage of the source line SL varies widely depending on data stored in the memory transistor TM. Therefore, the sense amplifier SA determines data corresponding to the charge trapped in the gate insulation film of the memory transistor TM based on the comparison result and outputs the data.

Next, another example of the memory circuit is explained with reference to FIG. 25.

Figure 25:
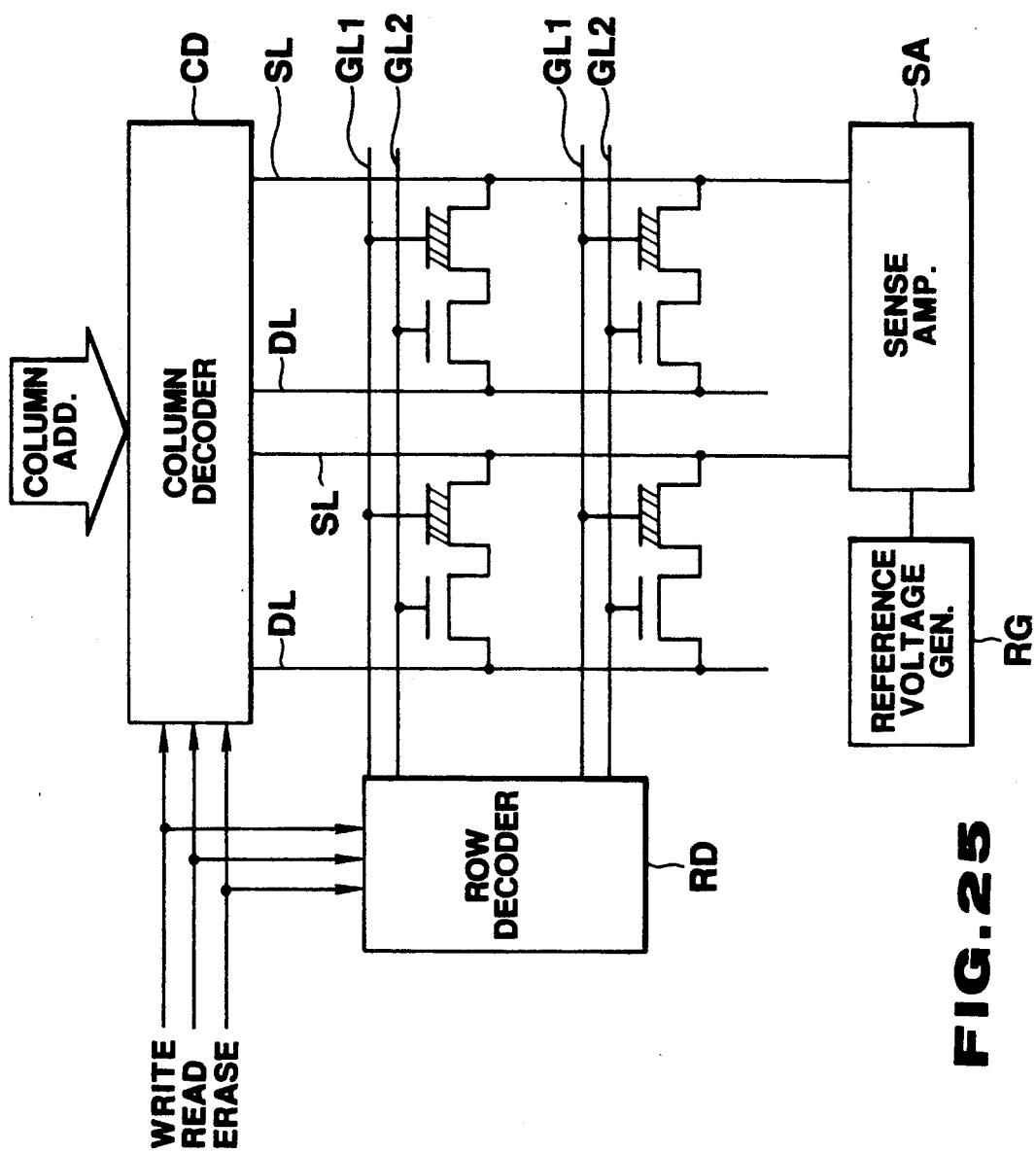

As shown in FIG. 25, the current path of a transistor TM used as a memory element is series-connected to the current path of a selection transistor TS to form a transistor pair. For example, the selection transistor TS is formed of an N-channel MOS transistor. A plurality of pairs of the transistors TS and TM are arranged in a matrix form. The gates of the memory transistors TM on the same row are commonly connected to a first gate line GL1 and the gates of the selection transistors TS on the same row are commonly connected to a second gate line GL2. The current paths of the selection transistors TS on the same column are commonly connected at one end to a drain line DL. The current paths of the memory transistors TM on the same column are commonly connected at one end to a source line SL. The gate lines GL1 and GL2 are connected to a row decoder RD. The drain lines DL and source lines SL are connected to a column decoder CD. The source lines SL are also connected to a sense amplifier SA. The sense amplifier SA is connected to a reference generating circuit RG. The row decoder RD is supplied with a row address, write-in control signal, readout control signal and erasing command signal, and the column decoder CD is supplied with a column address, write-in control signal, readout control signal and erasing command signal.

Now, the operation of the memory circuit shown in FIG. 25 is explained.

A) A data write-in operation (writing data of logic "1") is explained below.

First, a row address and a column address for specifying one of the memory transistors TM into which data is written are supplied to the row decoder RD and the column decoder CD and the write-in signal is set to an active level. The row decoder RD sets the voltage of the first gate line GL1 on the row which is specified by an input signal to Vp/2 (20 V), for example, sets the voltage of the second gate line GL2 on the selected row to VON (10 V) and sets voltages of the other gate lines to 0 V. The column decoder CD sets the voltages of the drain line DL and source line SL on the column selected by the input signal to −Vp/2 (−20 V), for example. The selection transistor TS is turned on in response to the voltage VON, causing the voltage Vp to be applied across the gate insulation film of the selected memory transistor TM. As a result, charges are trapped in the gate insulation film of the selected memory transistor, thereby completing the operation of writing data "1".

B) Next, the data erasing operation (writing data of logic "0") is explained below.

First, a row address and a column address for specifying one of the memory transistors TM having data to be erased are supplied to the row decoder RD and the column decoder CD and the erasing signal is set to an active level. The row decoder RD sets the voltage of the first gate line GL1 on the row which is specified by an input signal to −Vp/2, for example, sets the voltage of the second gate line GL2 to VON and sets voltages of the other gate lines to 0 V. The column decoder CD sets the voltages of the drain line DL and source line SL on the column selected by the input signal to +Vp/2, for example, and sets the voltages of the other drain and source lines to 0 V. The selection transistor TS is turned on in response to the voltage VON. Therefore, a voltage −Vp is applied across the gate insulation film of the selected memory transistor TM. As a result, charges are trapped in the gate insulation film of the selected memory transistor, thereby completing the operation of writing data "0".

C) The operation of reading out data from the memory element is explained below.

First, a row address and a column address for specifying one of the memory transistors TM from which data is read out are supplied to the row decoder RD and the column decoder CD and the readout signal is set to an active level. The row decoder RD sets the voltage of the first gate line GL on the row which is specified by an input signal to VSELECT (0 V), sets the voltage of the second gate line GL2 on the selected row to VON and sets voltages of the other gate lines to 0 V. The column decoder CD sets the voltage of the drain line DL on the column selected by the input signal to $V_D$ (for example, 10 V) and sets the source line SL on the selected column into the electrically floating state. The selected transistors TS and TM are turned on in response to the gate voltages VSELECT and VON and a current ID flows from the activated drain line DL into the sense amplifier SA via the transistors TS and TM and the source line SL. The level of the current ID is highly dependent on the contents of data stored in the memory transistor TM. As a result, the voltage of the source line SL varies depending on data stored in the memory transistor TM. The sense amplifier SA compares a voltage caused on the source line SL by the current ID with the reference voltage from the reference voltage generating circuit RG. The sense amplifier SA determines data corresponding to the charge trapped in the gate insulation film of the memory transistor TM based on the comparison result and outputs the data.

The above-described circuit construction and voltage relation are explained only as one example. For example, the relation between the voltage used for the write-in operation and that used for the erasing operation can be reversed. Further, the voltage applied between the gate electrode and the source and drain electrodes to write data can be set to 10 V, 20 V or 30 V, for example.

As described above, according to this invention, a memory function can be added to the conventional thin film transistor and the property thereof can be enhanced.

What is claimed is:

1. A memory transistor system having electrically writable and electrically erasable functions, comprising:
   a thin film transistor including:
      a semiconductor layer having a channel region;
      a source electrode electrically connected to said semiconductor layer;
      a drain electrode electrically connected to said semiconductor layer and formed separately from said source electrode;
      a gate electrode formed over said channel region of said semiconductor; and
      a gate insulating film means disposed between said semiconductor and said gate electrode and being in contact with aid channel region of said semiconductor for trapping electrical charges, said gate insulating film means including a silicon nitride film whose composition ratio of Si/N is 0.85 to 1.1;
   writing means for applying a writing voltage (+Vp) to said gate electrode relative to said source electrode;
   erasing means for applying an erasing voltage (−Vp) to said gate electrode relative to said source electrode; and
   reading out means for applying a read out voltage (Vd) to said drain electrode;
   whereby charges are trapped in said gate insulating film means so as to shift a threshold voltage (Vth), to the positive direction after an application of said writing voltage (+Vp), and to shift a threshold voltage (Vth) to the negative direction after an application of said erasing voltage (−Vp).

2. The memory transistor system of claim 1, wherein said semiconductor layer is made of amorphous or polycrystalline silicon.

3. The memory transistor system of claim 2, further comprising a n+-silicon contact layer interposed between said semiconductor layer and at least one of said drain electrode and said source electrode.

4. The memory transistor system of claim 1, wherein said thin film transistor is mounted on an insulating substrate.

5. The memory transistor system of claim 4, wherein said gate electrode and said gate insulating film means are disposed between said semiconductor layer and said insulating substrate.

6. The memory transistor system of claim 5, wherein said drain electrode and said source electrode are formed on a surface of said semiconductor layer opposing another surface which faces said insulating substrate.

7. The memory transistor system of claim 4, wherein said drain electrode and said source electrode are disposed between said semiconductor layer and said insulating substrate.

8. The memory transistor system of claim 7, wherein said gate electrode and said gate insulating film means are formed on a surface of said semiconductor layer opposing another surface which faces said insulating substrate.

9. The memory transistor system of claim 1, wherein said silicon nitride film of said gate insulating film means is 1000 to 3000 angstrom thick.

10. The memory transistor system of claim 1, wherein said gate insulating film means comprises two layers.

11. The memory transistor system of claim 10, wherein said gate insulating film means includes a non-trapping layer formed on a surface of said silicon nitride film opposing another surface which is in contact with said semiconductor layer.

12. The memory transistor system of claim 11, wherein said non-trapping layer is made of silicon nitride whose composition ration of Si/N is lower than 0.75.

13. The memory transistor system of claim 12, wherein said silicon nitride film is about 2000 angstrom thick.

14. The memory transistor system of claim 11, wherein said non-trapping layer is formed of polycrystalline.

15. The memory transistor system of claim 14, wherein said gate insulating film means comprises a plurality of two-layer structures formed of said gate insulating film and said polycrystalline film respectively.

16. The memory transistor system of claim 1, wherein said composition ratio of Si/N of said silicon nitride film is gradually reduced in the thickness direction from said semiconductor layer toward said gate electrode.

17. The memory transistor system of claim 1, wherein said gate electrode comprises two layers.

18. The memory transistor system of claim 17, wherein said gate electrode includes a polycrystalline layer.

19. The memory transistor system of claim 18, wherein said polycrystalline layer is about 200 angstrom thick.

20. A memory transistor system having electrically writable and electrically erasable functions, comprising:
 a memory transistor including;
  a semiconductor layer having a channel region;
  a source electrode electrically connected to said semiconductor layer;
  a drain electrode electrically connected to said semiconductor layer and formed separately from said source electrode;
  a gate electrode formed over said channel region of said semiconductor; and
  a gate insulating film means disposed between said semiconductor and said gate electrode and being in contact with aid channel region of said semiconductor for trapping electrical charges, said gate insulating film means including a silicon nitride film whose composition ratio of Si/N is 0.85 to 1.1;
 writing means for applying a writing voltage (+Vp) to said gate electrode relative to said source electrode, said writing means shifting a threshold voltage of said memory transistor to the positive direction;
 erasing means for applying an erasing voltage (−Vp) to said gate electrode relative to said source electrode, said erasing means shifting a threshold voltage of said memory transistor to the negative direction; and
 reading out means for applying a read out voltage (Vd) to said drain electrode;
 whereby the gate voltage-drain current characteristic of said memory transistor represents a hysteresis curve having a width, that is, a delta Vth, which is the difference between the threshold voltage defined by said writing means and that defined by said erasing means, which is greater than 15 volts.

21. The memory transistor system of claim 20, wherein said memory transistor is mounted on an insulating substrate.

22. The memory transistor system of claim 20, wherein said semiconductor layer is made of amorphous or polycrystalline silicon.

23. The memory transistor system of claim 22, further comprising a n+-silicon contact layer interposed between said semiconductor layer and at least one of said drain electrode and said source electrode.

24. The memory transistor system of claim 20, wherein said gate electrode and said gate insulating film means are disposed between said semiconductor layer and said insulating substrate.

25. The memory transistor system of claim 24, wherein said drain electrode and said source electrode are formed on a surface of said semiconductor layer opposing another surface which faces said insulating surface.

26. The memory transistor system of claim 20, wherein said drain electrode and said source electrode are disposed between said semiconductor layer and said insulating substrate.

27. The memory transistor system of claim 20, wherein said silicon nitride film of said gate insulating film means is 1000 to 3000 angstrom thick.

28. The memory transistor system of claim 20, wherein said gate insulating film means comprises two layers.

29. The memory transistor system of claim 28, wherein said gate insulating film means includes a non-trapping layer formed on a surface of said silicon nitride film opposing another surface which is in contact with said semiconductor.

30. The memory transistor system of claim 29, wherein said non-trapping layer is formed of polycrystalline.

31. The memory transistor system of claim 20, wherein said composition ration of Si/N of said silicon nitride film is gradually reduced in the thickness direction from said semiconductor layer toward said gate electrode.

* * * * *